United States Patent [19]
Sauer

[11] Patent Number: 5,471,208
[45] Date of Patent: Nov. 28, 1995

[54] REFERENCE LADDER AUTO-CALIBRATION CIRCUIT FOR AN ANALOG TO DIGITAL CONVERTER

[75] Inventor: Donald J. Sauer, Monmouth, N.J.

[73] Assignee: David Sarnoff Research Center, Inc., Princeton, N.J.

[21] Appl. No.: 247,155

[22] Filed: May 20, 1994

[51] Int. Cl.⁶ .................................................. H03M 1/10
[52] U.S. Cl. ........................ 341/120; 341/154; 341/155
[58] Field of Search ............................. 341/118, 120, 341/154, 155, 158, 159

[56] References Cited

U.S. PATENT DOCUMENTS

| | | |
|---|---|---|
| 4,228,423 | 10/1980 | Schwerdt . |
| 4,262,221 | 4/1981 | Dingwall . |
| 4,385,286 | 5/1983 | Haque . |
| 4,388,612 | 6/1983 | Takagi et al. . |
| 4,496,935 | 1/1985 | Inoue et al. ........................... 341/118 |
| 4,498,072 | 2/1985 | Moriyama . |
| 4,553,128 | 11/1985 | Pilost . |
| 4,598,269 | 7/1986 | Penney . |
| 4,611,195 | 9/1986 | Shosaku . |
| 4,618,847 | 10/1986 | Iida et al. . |
| 4,620,179 | 10/1986 | Cooper et al. . |
| 4,691,189 | 9/1987 | Dingwall et al. . |
| 4,764,750 | 8/1988 | Kawada . |
| 4,804,941 | 2/1989 | Yoshii ..................................... 341/155 |
| 4,873,525 | 10/1989 | Iida . |
| 4,924,225 | 5/1990 | Dingwall et al. ......................... 341/118 |
| 4,940,981 | 7/1990 | Naylor et al. . |
| 4,989,003 | 1/1991 | Sauer . |
| 4,999,633 | 3/1991 | Draxelmayr . |
| 5,010,338 | 4/1991 | Miki et al. . |
| 5,016,014 | 5/1991 | Bitting . |
| 5,028,926 | 7/1991 | Tokuhiro . |
| 5,032,744 | 7/1991 | Liu . |
| 5,065,045 | 11/1991 | Mok . |
| 5,136,183 | 8/1992 | Moyal et al. . |
| 5,160,930 | 11/1992 | Hosotani et al. ......................... 341/154 |
| 5,262,779 | 11/1993 | Sauer . |
| 5,272,481 | 12/1993 | Sauer . |

Primary Examiner—Howard L. Williams
Attorney, Agent, or Firm—William J. Burke

[57] ABSTRACT

An auto-calibrated reference resistor ladder network is disclosed which is suitable for use in a precision analog to digital converter. Resistors in the ladder are connected to an auto-calibration circuit which continually measures the potential developed across each of the connected resistors and adjusts the resistance of the resistor to match the measured potential to a reference potential. In the disclosed circuit, the reference potential is the potential developed across a defined one of the resistors.

10 Claims, 12 Drawing Sheets

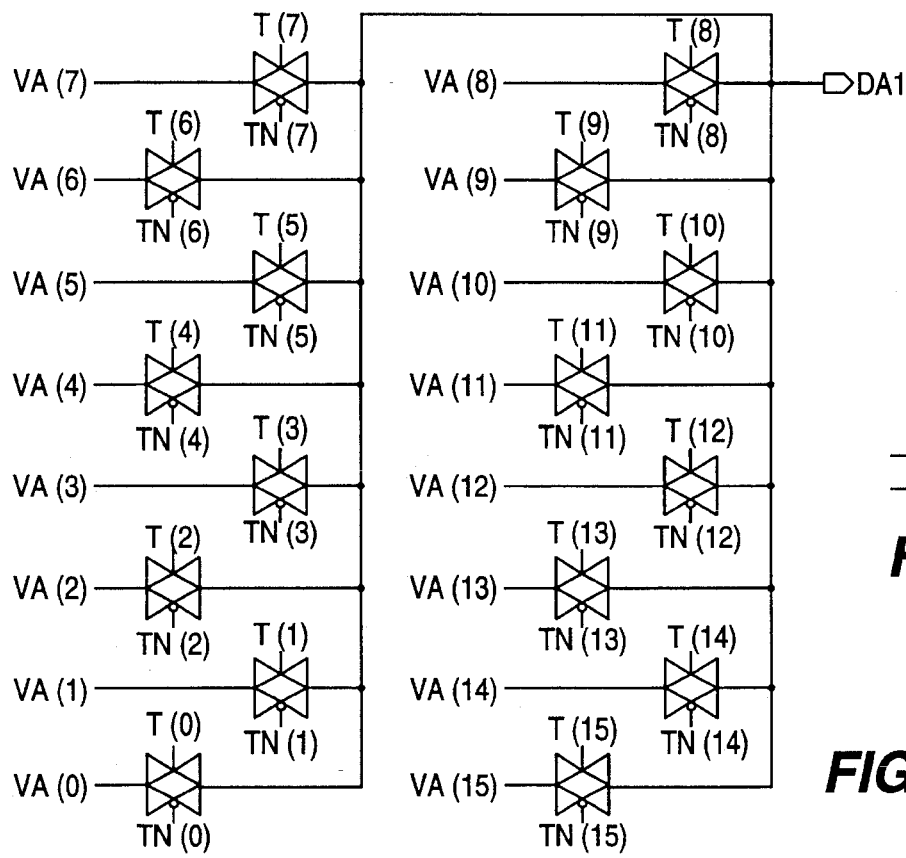
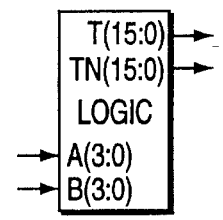
FIG. 8a
FIG. 8b
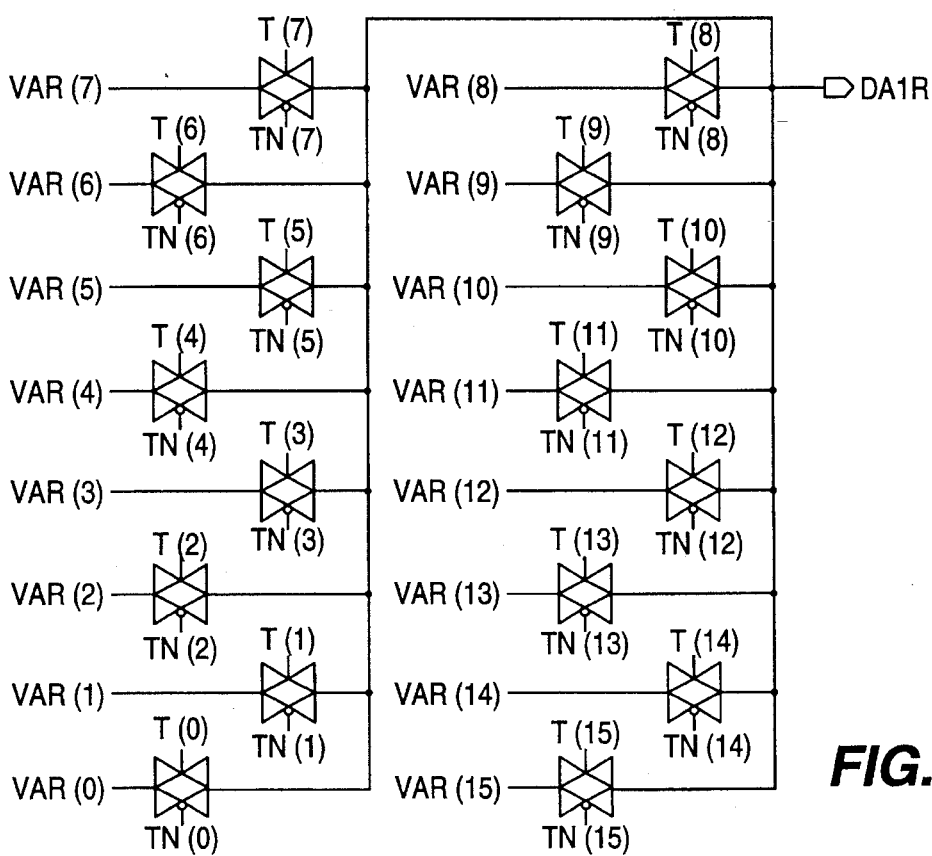
FIG. 8c

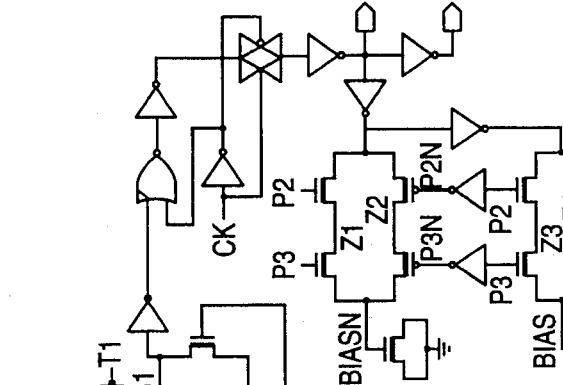
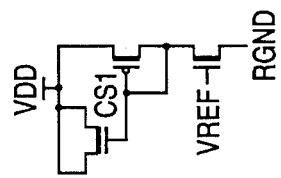
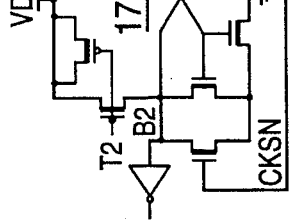
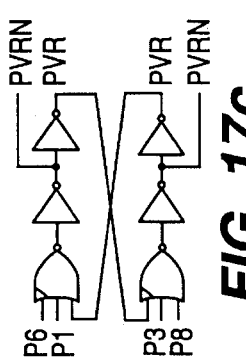
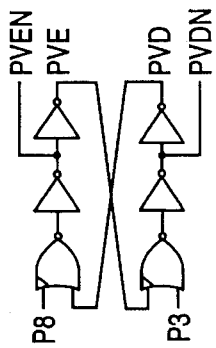
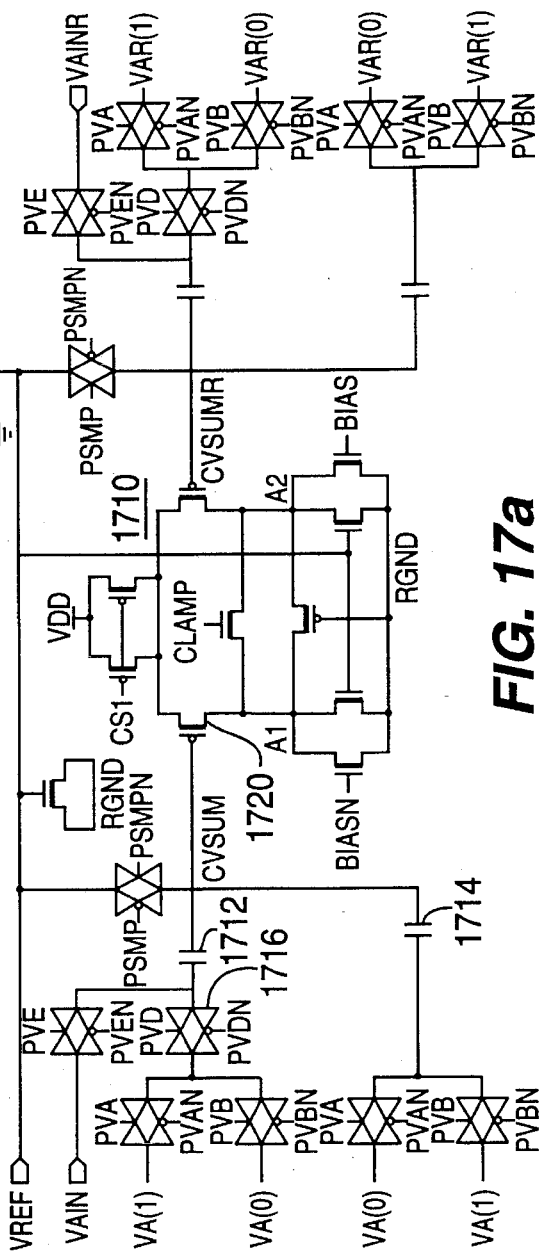
FIG. 17a
FIG. 17b
FIG. 17c
FIG. 17d
FIG. 17e

REFERENCE LADDER AUTO-CALIBRATION CIRCUIT FOR AN ANALOG TO DIGITAL CONVERTER

The invention relates to an analog to digital converter (ADC) which operates at high speed and provides high resolution, and more particularly, to an ADC which uses a dynamically calibrated voltage source, configured as a series of resistors, or resistor ladder.

BACKGROUND OF THE INVENTION

In digital signal processing it is necessary to convert an analog signal into a digital format. To insure reasonable fidelity in this conversion, it is desirable to sample the analog signal at a rate substantially greater than analog signal bandwidth. These sampled signal values are then converted sample by sample at high speed into their equivalent digital values represented by "N" number of binary bits. Prior art ADCs, which typically use bipolar transistors, are able to operate at high rates (e.g., 50 MHz) and with 10-bit resolution. These ADCs require relatively large amounts of electrical power and are very costly. On the other hand, attempts to implement high speed, multi-bit ADCs with MOS technology have not been as successful as desired. Either cost was high because of poor chip yield or performance was substantially less than could be obtained using bipolar transistor technology.

A prior ADC, termed an "N-flash" ADC, simultaneously produces "N" data bits in parallel from a sampled analog voltage. The ADC comprises $2^N-1$ comparators which are closely matched to each other with each capable of high resolution. The ADC circuit momentarily connects all of these comparators at once to an input signal circuit. A decoder circuit coupled to all of the comparators then determines the values of the N bits corresponding to the analog value of the input signal being sampled at that instant. An advantage of this type of ADC is the high speed at which it can operate. An important disadvantage is relatively low impedance load (and corresponding large switching transients) caused by connecting all of the comparators to the input circuit at the same time. As an example, a 10 bit flash ADC uses 1023 comparators. Flash ADCs generate their reference analog voltages from a series-connected resistor circuit, commonly known as a resistor ladder. Typically, high resolution flash ADCs need to have the resistors in the ladder "trimmed" using, for example, a laser, to meet the tolerances required for high-resolution operation.

Another type of ADC is a successive approximation device. This type of ADC, in its simplest form, calculates an output digital value from a sampled analog potential one bit at a time, from the most significant bit to the least significant bit. As each bit of the output value is generated, the partial digital value is converted to an analog value by an internal digital to analog converter (DAC), and the analog value is subtracted from the original sample value. This difference value is then used to generate the next less significant bit of the digital output value. In this form, at least N comparison operations are needed to produce an N-bit digital value.

In a more complex form, this type of ADC employs N or more successive approximation stages in parallel, each operating on a respectively different staggered clocking phase. In this configuration, one N-bit digital output value is produced for each clock cycle. An exemplary successive approximation ADC is described in my earlier U.S. Pat. No. 5,272,481 entitled ANALOG TO DIGITAL CONVERTER which is hereby incorporated by reference for its teachings on successive approximation ADCs.

One problem with successive approximation ADCs is the accuracy of the analog value that is generated by the internal DACs. The reference voltages for these DACs are generated from a resistor ladder. Due to process variations, the values of these resistors may vary from specifications within an integrated circuit and from one integrated circuit to the next. Accordingly, the reference potentials used by the DACs may not be consistent within an ADC device or from one ADC to the next.

SUMMARY OF THE INVENTION

The present invention is embodied in an analog to digital converter which uses a resistor ladder to produce reference potentials. In accordance with the present invention, individual resistances in the resistor ladder are coupled to a controlled variable resistance device and to a calibration circuit. The calibration circuit periodically compares reference potentials generated across each of the resistances to a predetermined reference potential and adjusts the controlled variable resistance to minimize differences between each of the reference potentials and the predetermined reference potential.

BRIEF DESCRIPTION OF THE DRAWING

FIGS. 8a, 8b and 8c are schematic diagrams of switching circuitry suitable for use in the DAC shown in FIG. 5.

FIGS. 17a, 17b, 17c, 17d and 17e are schematic diagrams, partly in logic schematic diagram form of calibration circuitry suitable for use with the voltage reference divider circuit shown in FIG. 15 and the control circuitry shown in FIGS. 16a through 16d.

DETAILED DESCRIPTION

Figure 1:
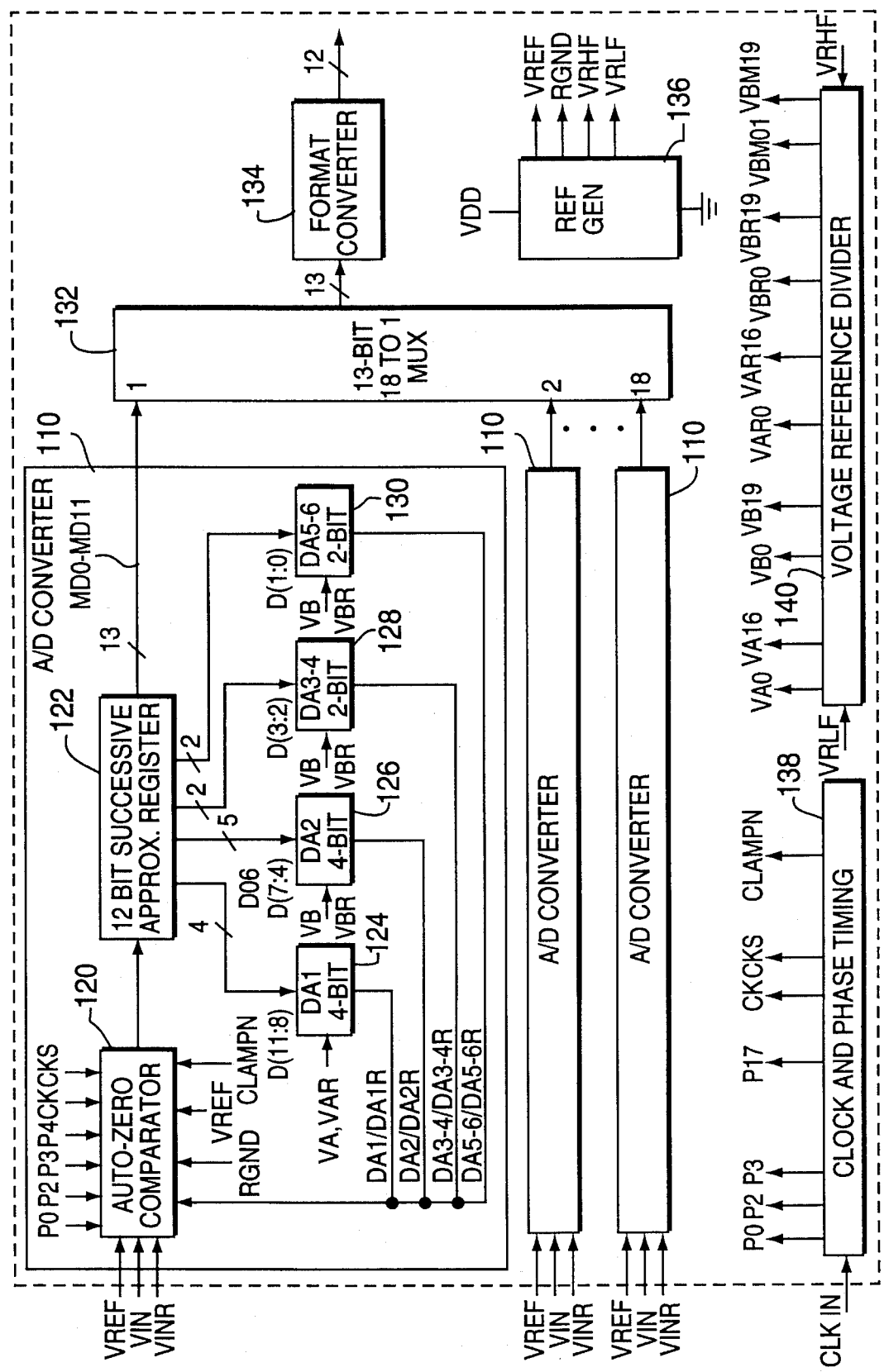
FIG. 1 is a block diagram of an ADC system which includes an embodiment of the present invention including an assembly of multiple ones of identical ADCs arranged in parallel and driven by skewed clock signals.

FIG. 1 is a block diagram of an ADC system which includes an embodiment of the present invention. This system includes 18 ADCs, which operate in parallel, responsive to phase-skewed clock signals in order to generate digital output samples corresponding to the analog input signal at a relatively high rate (e.g. 50 MHz). Each of these ADCs includes an auto-zero comparator 120, which receives the analog signal, VIN. Although the ADC system shown in FIG. 1 includes 18 ADCs, only one ADC is shown in detail. Each ADC 110 has an output port which is connected to a respective one of the input terminals of a multiplex (MUX) unit 132. In the exemplary embodiment of the invention, each ADC 110 provides a 13-bit signal to the multiplexer 132. The multiplexer 132 provides a sequence of the 13-bit signals applied to its input ports to a format converter 134. Each 13-bit value provided by the multiplexer 132 is in non-standard binary format. Format converter 134 converts each of these words into a standard 12-bit format to produce the output values of the ADC system shown in FIG. 1.

Each ADC 110 is driven by a clock and phase timing unit 138 which as shown here, generates eighteen phases P(0) to P(17), clock signal, CK, a phase-advanced clock signal, CKS, a clamp pulse CLAMPN. The clock phases P(0) through P(17) are generated by selecting one of eighteen consecutive clock pulses of the signal CK. This produces 18 clock signals, each having a respectively different phase and a frequency which is one-eighteenth of the frequency of the signal CK. Each of the ADCs 18 is driven by all of the phases P(0) through P(17), however, the clock phase which is P(1) for the first ADC 110 is clock phase P(0) for the second ADC 110 and clock phase P(17) for the third ADC 110.

Thus the eighteen ADCs 110 respectively and repeatedly sample the input voltage VIN at eighteen successive instants. This arrangement effectively results in a composite sampling rate for the entire ADC system assembly shown in FIG. 1 which is 18 times the sampling rate of an individual ADC 110. It is to be understood that the system may be configured with fewer (or more) ADCs 110 to achieve different sampling rates.

Each ADC 110 includes an auto-zero comparator 120 which produces a bit-serial output signal that is applied to a 12-bit successive approximation register (SAR) 122. Comparator 120 momentarily samples the input voltage VIN, and thereafter, in a clocked sequence in combination with the SAR 122, determines bit-by-bit the digital value of the sampled input voltage.

SAR 122 provides the four most-significant-bits (MSBs) of its stored value to a first four-bit DAC 124 which in turn provides a pair of analog voltages, DA1 and DA1R to the auto zero comparator 120. In the same way, SAR 122 provides the four next MSBs, plus an offset bit, to a second four-bit DAC 126. This DAC generates another pair of analog voltages, DA2 and DA2R which are applied to the comparator 120. The four least significant bits (LSBs) of the value held in the SAR 122 are converted by two 2-bit DACs 128 and 130, into four pairs of analog signals, DA3, DA3R, DA4, DA4R, DA5, DA5R, DA6 and DA6R. The DACs 124, 126, 128 and 130 are described below with reference to FIGS. 6–14.

All of the ADCs 110 are connected to a single master voltage reference source 140, which is described below with reference to FIGS. 15 through 17. The reference voltages VA0 through VA16, VAR0 through VAR16, VB0 through VB19 and VBR0 through VBR19 are automatically and continually calibrated against a master voltage reference through a sequence of steps which are described below. These voltage reference signals divide a range of voltages defined by a reference voltage low level signal, VRLF, and a reference voltage high level signal, VRHF. Because of this automatic calibration, there is no need for laser trimming of the resistor ladders. The analog voltages produced by each DAC are kept accurate and, thus, each ADC 110 is automatically made very accurate within its own cycle of operation. Consequently the multiple operations of all of the ADCs 110 in system shown in FIG. 1 are tied together with equal, automatically obtained accuracy from the single master voltage reference the clock pulses (CK) and the phases (P0) to P(19) produced by the timing unit 138 (shown in FIG. 1).

The voltage reference signals, VRHF and VRLF are produced by a reference generator circuit 136. This circuit employs a band-gap voltage reference source (not shown) to generate these signals and a voltage reference signal VREF which has a nominal potential of 2.5 volts. In addition, the reference generator 136 uses a reference ground signal, RGND, which is nominally at the substrate ground potential but which is fully diode-isolated from the substrate. This configuration attenuates noise components of the substrate ground signal which propagate through the substrate, for example, from other ones of the ADCs 110. The reference generator circuitry 136 is not described in detail. Circuitry suitable for use as the reference generator 136 can be readily designed by one of ordinary skill in the art from the description presented below and the description presented in my above-referenced patent.

The signal CLK IN, which has a frequency of 20 MHz, is used, by the clock and phase timing circuitry 138, to generate 18 clock phase pulses, P0 through P17, and three delayed clock signals CK, CKS and CLAMPN. Each of the clock phase signals P0 through P17 is a pulse clock signal having a frequency of 1.11 MHz. Each pulse of one of these clock phase signals is a single pulse of the signal CK separated from the next pulse by 18 periods of the signal CK. Each of these clock signals is separated from the next clock signal by one period of the signal CK. If all 18 of the signals P0 through P17 were combined, the result would be the signal CK.

The signals CKS and CLAMPN have phases which are advanced from the phase of the signal CK. In the clock and phase timing circuitry, this is accomplished by producing the signals CKS and CLAMPN with less delay with respect to the signal CLK IN than the signal CK. In the exemplary embodiment of the invention, the signal CLAMPN is delayed with respect to the signal CKS. The circuitry 138 is not described in detail since suitable circuitry may be produced by one of ordinary skill in the art based on the description of the signals provided below and on my the above-referenced patent.

Figure 2:
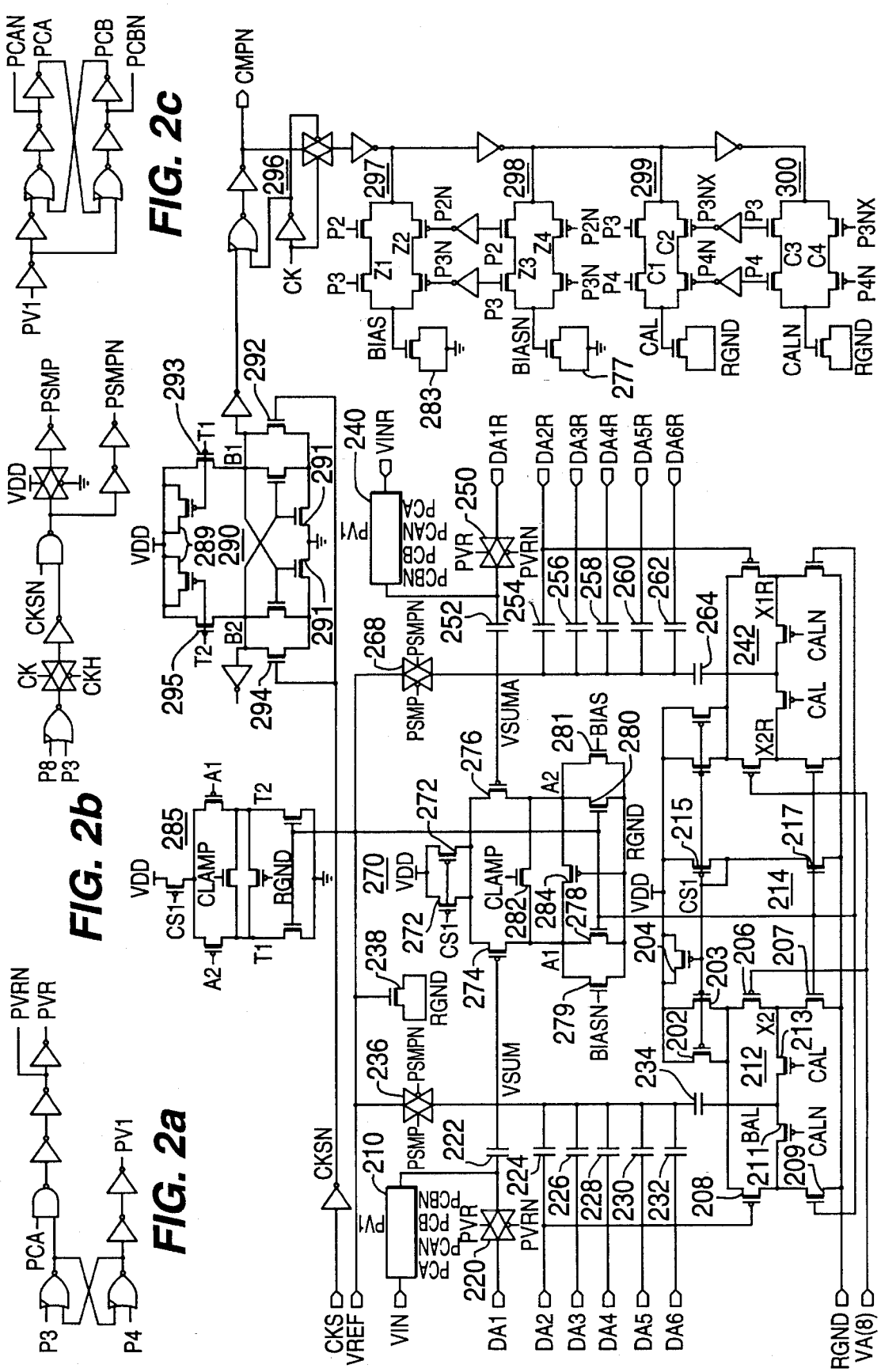
FIGS. 2a, 2b and 2c are schematic diagrams, partly in logic diagram form, of a comparator circuit suitable for use in one of the ADCs shown in FIG. 1.

FIG. 2 is a schematic diagram, partly in logic diagram form, of an auto-zero comparator suitable for use as the comparator 110 of FIG. 1. In overview, the analog input signal VIN is applied to a summing network, which combines the input value with partial results generated by the DACs 124, 126, 128 and 130 at a node VSUM. The difference between the signal at this node and the signal at the node VSUMR is amplified, by a cascade combination of an auto-biased amplifier 270, and a differential amplifier 285. The output signal of the amplifier 285 is applied to a regenerative latch 290. The regenerative latch switches to a logic-high state, if the next bit in the digital value is to be a logic high value; or to a logic-low state, if the next bit in the digital value is to be a logic low value. The output signal of the auto-zero comparator is a signal CPMN, which is an inverted version of the instantaneous state of the latch 290.

The amplifier 270 is a differential amplifier which receives the input signal VIN at one input terminal and a signal VINR at the other input terminal. The signal VINR is the return path of the signal VIN. If, for example, the signal VIN is referenced to a ground plane as an input signal to the ADC shown in FIG. 1, then the terminal VINR is coupled to that ground plane. This return signal is applied to the ADC to nullify any high frequency common mode signals which may interfere with the signal VIN. To the extent that these signals also appear in the return path, they are nullified in the differential amplification performed by the circuitry shown in FIG. 2. In most instances, the signal VINR and the other signals applied to the node VSUMR are logic-zero values. Only when there are relatively high-frequency noise signals propagating from the substrate is the signal at node VSUMR non-zero. In these instances, however, the noise signals are also present at the node VSUM. Because it is the difference between the potentials at the nodes VSUM and VSUMR which is amplified by the amplifier 270, the noise signals tend to cancel and do not contribute significantly to the final result.

As described below, the ADC circuitry includes parallel circuitry for generating return path signals for the comparator shown in FIG. 2 which correspond to similar signals in the input path. This parallel circuitry is used to nullify common mode signals which may occur in the DACs 124, 126, 128 and 130 as well as in the voltage reference divider circuit 140. In the material that follows, the following conventions are used, a signal name ending in "R" represents a return path signal which corresponds to the signal having the same name but without the "R."

In the same way, a switching signal ending in the letter "N" is an inverted version of the switching signal of the same name but without the "N." For the sake of brevity, the inverter circuits which are used generate the complementary switching signals are not described.

As set forth above, the circuitry shown in FIG. 2 generates a complete 12-bit digital value representing an analog input value VIN during a digitizing interval which spans 18 cycles of the clock signal CK. The first steps performed in this interval are calibration steps. As described below, a sample of the input signal VIN is not provided until the positive-going transition of phase P4. The calibration steps occur during phases P0 through P3.

As described below, with reference to FIG. 4, during phase P0, the SAR 122 is reset to provide values of logic-zero for the signals DA1, DA2, DA3, DA4, DA5 and DA6 as well as for the corresponding return signals DA1R, DA2R, DA3R, DA4R, DA5R and DA6R.

During the time intervals spanned by phases P1 and P2, the circuitry shown in FIG. 2b generates signals PSMP and PSMPN. These signals are applied to respective transmission gates 236 and 268 to precharge the respective nodes VSUM and VSUMR to the potential VREF. VREF is generated by the reference generator circuit 136 shown in FIG. 1. This circuit includes a voltage divider circuit (not shown) which sets the potential VREF approximately in the center of the range defined by $V_{DD}$ and ground. In the exemplary embodiment of the invention, $V_{DD}$ is +5 volts. Accordingly, the nominal value of VREF is 2.5 volts. The step of precharging the nodes VSUM and VSUMR to 2.5 volts biases the PMOS input transistors 274 and 276 to detect slight variations in potential from this 2.5 volt reference.

The nodes VSUM and VSUMR are set to this potential in order to accurately set the bias points of the preamplifier 270. The preamplifier 270 is implemented with a differential PMOS input stage (transistors 274 and 276) which have as their load elements a pair of NMOS current sources (transistors 278 and 280). The gate electrodes of the transistors 278 and 280 are coupled to receive the potential VREF, as such these transistors exhibit a fixed resistance path between the drain electrodes of the transistors 274 and 276 and ground.

The amplifier 270 also employs a common mode DC passive clamp circuit (transistor 284). The passive clamp circuit is a resistance which averages the potentials at nodes A1 and A2, the drain electrodes of the respective transistors 274 and 276, if either node exceeds the threshold potential of PMOS transistor 284. In addition to the passive clamp circuit, the amplifier 270 includes an active clamp circuit (transistor 282). This circuit forms a low-impedance path between the drain electrodes of the transistors 274 and 276 immediately before the comparison. This low impedance effectively resets the differential amplifier, preparing it to produce an output signal, between nodes A1 and A2, which represents the amplified difference between the signals VSUM and VSUMR.

Operational power is applied to the preamplifier 270 via transistor 272 which forms the output stage of a current mirror, the input stage of which is provided by transistor 215 of the gain adjust circuit 214, described below. Ideally, the amplifier 270 divides a fixed current between the transistors 274 and 276, based only on the relative values of the signals VSUM and VSUMR. The operating point of the amplifier is set by the load resistance defined by the transistors 278 and 280. In addition, the amplifier 270 includes two transistors, 279 and 281, which are controlled by the respective signals BIASN and BIAS, that adjust the bias point of the amplifier 270 to ensure that any difference between the potentials VSUM and VSUMR is amplified. In the exemplary embodiment of the invention, preamplifier 270 has a gain of approximately 10.

The transistors 274 and 276, as MOS devices, may be modeled as voltage variable current sources. In the circuit shown in FIG. 2, the channel current of each of the transistors 274 and 276 is determined by applying the potential VREF to their respective gate electrodes. To the extent, however, that there is a difference in the current provided by either transistor 274 or 276, there may be a range of differential input potentials for which the comparator 270 produces erroneous results. The bias circuit acts to automatically correct these errors by ensuring that the transistors 274 and 276 pass the same current when the potential VREF is applied to their gate electrodes. The operation of the automatic bias circuit is described below.

As set forth above, in the time interval defined by the phases P1 and P2, the signal VREF is applied to the gate electrodes of transistors 274 and 276. Ideally, both of the transistors 274 and 276 should be biased in their conductive regions at the same point and, so, should pass the same amount of current. If they do not, then the differential output signal between nodes A1 and A2 is non-zero. This potential is amplified by the differential amplifier 285 and is detected by the regenerative latch 290. The latch 290 passes the detected signal through a transmission gate 296 where it is inverted and applied to a first switched capacitor filter 297. The signal is inverted again and applied a second switched capacitor filter 298. In the filters 297 and 298, these signals charge parasitic capacitances at nodes Z1, Z2, Z3 and Z4, during phase P2. Any accumulated charge is then passed from the parasitic capacitances to the capacitors 283 and 277 during clock phase P3.

If there is an imbalance between transistors 274 and 276, one of the capacitors 277 and 283 is charged to a higher potential than the other capacitor. These potentials, BIASN and BIAS, in turn, are applied to the gate electrodes of the transistors 279 and 281. If BIASN is greater than BIAS, the load resistance provided by transistor 278 is reduced by a larger amount than the load resistance represented by transistor 280. This changes the relative biasing point of the transistors 274 and 276. This adjustment continues through several digitizing cycles until relatively stable values are established for the biasing potentials BIAS and BIASN. Once these potentials are established, the differential preamplifier 270 is biased such that even a small difference between VSUM and VSUMR is properly amplified and passed on to the second preamplifier 285.

In addition, when the difference signal between VSUM and VSUMR is sufficiently large, the ON resistance of the passive clamp transistor 284 serves as a load for the PMOS differential input transistors 274 and 276. This load resistance lowers the voltage gain and output impedance of the preamplifier circuit 270, thereby reducing the time constant of the preamplifier and improving its transient response recovery time. Due to the differential (i.e. antiphasal) nature of the signal voltages at nodes A1 and A2, the average potential developed by the transistor 284, has only a small signal component. The output signals A1 and A2 of the preamplifier 270 are applied to the respective input terminals A1 and A2 of the preamplifier 285.

The preamplifier 285 is essentially the same as preamplifier 270 except that the amount of operational current is halved and there is no automatic biasing circuit. Accordingly, the preamplifier 285 is not described in detail. The output signal of the preamplifier 285 is provided as the potential difference between nodes Y1 and Y2. In the exemplary embodiment of the invention, the preamplifier 285 has a gain of approximately 6, accordingly, any difference between VIN and VINR is amplified by a factor of 60 before it is applied to the differential latch 290.

This potential difference is applied to the gate electrodes of the transistors 295 and 293 of the differential latch 290. The latch 290 is essentially the same as that described in my above-referenced patent except for the addition of the capacitors 291. These capacitors limit the noise bandwidth of the latch and thereby improve its sensitivity. Before each pulse of the signal CK, a phase leading clock signal, CKSN is applied to the gate electrodes of two transistors 292 and 294. These transistors, when they become conductive, discharge the capacitors 291, effectively resetting the latch 290. Immediately after the latch is reset, its next state is determined by the differential between the potentials Y1 and Y2 provided by the amplifier 285.

The state of the latch 290 is inverted and applied to a gating circuit which gates the state signal by the signal CK to ensure that only valid state values are provided synchronous with the positive-going pulse of the signal CK. The gated signal is inverted and provided as the output signal of the comparator, CMPN.

In normal operation, after the calibration steps are performed in phases P0 through P3 as described above, the input signal VIN and the return signal VINR are sampled onto respective capacitors 222 and 252 using constant impedance sampling switches 210 and 240. These switches are described below with reference to FIG. 3. Other input signals to the summing junction VSUM are analog potentials, DA2, DA3, DA4, DA5 and DA6, while other input signals to the summing junction VSUMR are analog potentials DA2R, DA3R, DA4R, DA5R and DA6R. These potentials are provided by the DACs 126, 128 and 130, shown in FIG. 1. A final input signal to the summing junction VSUM is a signal BAL, applied by the gain adjust circuit 234, via the capacitor 918. During phase P4, the potentials DA2, DA2R, DA3, DA3R, DA4, DA4R, DA5, DA5R, DA6 and DA6R are fixed at their nominal low levels while VIN is sampled. In this configuration, the left side of capacitor 222 is charged to VIN and the right side of capacitor 222 is charged to VREF while the right and left sides of capacitor 252 are charged to VINR and VREF, respectively.

Next, the transmission gates 236 and 268 are turned off responsive to the signals PSMP AND PSMPN, disconnecting the nodes VSUM and VSUMR from VREF. This may change the voltage on VSUM by a small residual offset value due to an imbalance in the capacitively coupled clock component from the negative-going transition of PSMP and the positive-going transition of PSMPN.

Next, the constant impedance sampling switches 210 and 240 disconnect the respective capacitors 222 and 252 from the input signals VIN and VINR. The transmission gates 220 and 250 are turned on, connecting the left side of the capacitor 222 to the analog potential DA1 and connecting the right side of the capacitor 252 to the analog potential DA1R. Both DA1 and DA1R are provided by DAC 124. After a defined settling time, the voltage at nodes VSUM and VSUMR are determined in accordance with the equations (1) and (2).

$$VSUM = VREF + (DA1 - VINR)*(C222/CT) + \\ DA2*(C224/CT) + DA3*(C226/CT) + \\ DA4*(C228/CT) + DA5*(C230/CT) + \\ DA6*(C232/CT) + BAL*(C234/CT) \tag{1}$$

$$VSUMR = VREF + (DA1R - VIN)*(C252/CTR) + \\ DA2R*(C254/CTR) + DA3R*(C256/CTR) + \\ DA4R*(C258/CTR) + DA5R*(C260/CTR) + \\ DA6R*(C262/CTR) + BALR*(C264/CTR) \tag{2}$$

where BAL and BALR are the potentials developed at the output of the gain adjust circuit 214, described below, Cx represents the capacitance of capacitor X and CT and CTR are the respective total capacitances on nodes VSUM and VSUMR, respectively as defined by equations (3) and (4).

$$CT=C222+C224+C226+C228+C230+C232+C234+Cpsum \tag{3}$$

$$CTR=C252+C254+C256+C258+C260+C262+C264+CpsumR \tag{4}$$

where Cpsum and CpsumR are the parasitic capacitance on respective nodes VSUM and VSUMR.

Note that the voltage at node VSUM corresponds to the difference between the input signal VIN on one hand and the sum of the potentials DA1 through DA6 provided by the DACs 124, 126, 128 and 130 on the other hand. In the same way, the potential at node VSUMR corresponds to the difference between the return signal VINR and the sum of the potentials DA1R through DA6R. The capacitors are scaled to sum the charges provided by the DACs 124, 126, 128 and 130 in proper proportions. In the exemplary embodiment of the invention, the capacitors 222 through 234 and the capacitors 252 through 264 have values as shown in Table 1, assuming a unit capacitance value of C.

TABLE 1

| Capacitor | | Value |
| --- | --- | --- |
| 222 | 252 | 16C |
| 224 | 254 | 8C |
| 226 | 256 | C |
| 228 | 258 | C |
| 230 | 260 | C |
| 232 | 262 | C |
| 234 | 264 | C |

In the exemplary embodiment of the invention, C is 50 femtofarads (fF).

Variations in the exact capacitance ratio of capacitor 222 to capacitor 224, and of capacitor 252 to capacitor 254, which ratio is nominally 2, are compensated in the autocalibration loop by the gain adjust circuit 214.

In the exemplary embodiment of the invention, all capacitors are made using deposited inter-level dielectric films. As is well know, capacitors made in this manner may be typically matched to better than 1% over small layout dimensions (approximately 120μm by 120μm). Capacitances can be effectively multiplied by using parallel combinations of matched capacitors. The inventors have determined that, using these techniques, the relative values of the capacitors used in each of the auto-zeroed comparators 120 may be controlled to achieve an accuracy of better than ±0.25 LSB for the 12-bit ADC.

The gain adjust circuit 214 provides a highly linear variable attenuation of the voltages DA2 and DA2R. In the exemplary embodiment of the invention, this attenuation is applied over an input signal range of 0 to 250 mv. The gain of the circuit 214 is adjustable from +0.2 to –0.2. The DC offset of the output signals BAL and BALR provided by the gain adjust circuit 214 are not critical since, in this application, these signals are capacitively coupled to the node VSUM and VSUMR. The circuit 214 has, however, been designed to provide good common mode rejection for variations in VDD and VREF.

The gain adjust circuit 214 includes two identical circuits, 212 and 242 which provide the respective signals BAL and BALR. For the sake of brevity only one of these circuits, 212 is described in detail. The gain adjust circuit uses calibration potentials, CAL and CALN which are generated by two switched capacitor filters 299 and 300. These filters operate in the same manner as the switched capacitor filters 297 and 298, described above, except that the filters 299 and 300 operate to accumulate the output signal provided by the latch 290 during phase P3 while the filters 297 and 298 operate to accumulate the output signal provided during phase P2. The output signal of the latch 290 during phase P3 is the amplified difference between VSUM and VSUMR which is measured during the autocalibration phase P2. If $V_{FS}$ is the full-scale voltage that may be converted by the ADC 110, during the autocalibration cycle of phase P2, DA1 is switched from $V_{FS}/16$ to zero while DA2 is switched from 0 to $V_{FS}/16$ (the highest potential that can be provided for the signal DA2). The net change on VSUM and VSUMR after these changes should be zero. To the extent that this difference signal is non-zero, it is sensed and accumulated to form the signals CAL and CALN. Thus, the signals CAL and CALN cause the linear differential attenuators 212 and 242 to compensate for slight differences between the input values DA1 and DA2 applied to the differential amplifier 270 which are caused by a variation from the desired capacitance ratios.

The linear differential attenuator 212 is formed by transistors 202, 203, 204, 206, 207, 208, 209, 211 and 213. This attenuator sums portions of inverted and non-inverted signals derived from the signal DA2, one of the output signals of the DAC 126, based on the control voltages CAL and CALN to generate the control potential BAL.

The input signal to the linear differential attenuator is the signal DA2 provided by the DAC 126. It is this signal which is attenuated and then added back to the signal at the summing junction VSUM to compensate for variations in capacitor ratios between capacitors 222 and 224.

The linear differential attenuator 212 is controlled by the signals CAL and CALN. Transistors 206 and 208 form a PMOS differential pair that divides current provided by transistors 202 and 203 which are on the output legs of the current mirror. The input leg of the current mirror are the transistors 215 and 217. The gate electrode of transistor 217 is coupled to receive the potential VREF and, so to draw a fixed current through transistor 215. Because transistors 215, 202 and 203 are configured as a current mirror, the drain current of each of the transistors 202 and 203 matches the drain current of transistor 215.

Since the gate electrode of the PMOS transistor 206 is coupled to VA(0), the differential amplifier is balanced when the potential DA2 is equal to 0 volts. In this instance the drain current flowing in both transistors 206 and 208 is equal to the current flowing through transistor 217. Transistors 202 and 203 have relatively low impedances and operate as resistors in the linear portion of their respective output characteristics with a relatively small drain to source voltage drop (Vds). The signal at node X1 is of opposite phase to the signal DA2, applied to the gate electrode of transistor 208 while the signal at node X2 is in phase with the signal DA2.

The output signal BAL of the gain adjust circuit 212 is a linear summation of the potentials at nodes X1 and X2 which, depending on the resistance ratio of transistors 211 and 213 (proportional to the ratio of CAL and CALN), may be in phase with or out of phase with the signal DA2. This circuit provides an adjustment range in gain from about –0.02 to +0.02. in the DAC 126 shown in FIG. 1, this is sufficient to compensate for expected variations in capacitance ratios between the pairs of capacitors 222 and 224 and 252 and 254.

Figure 3:
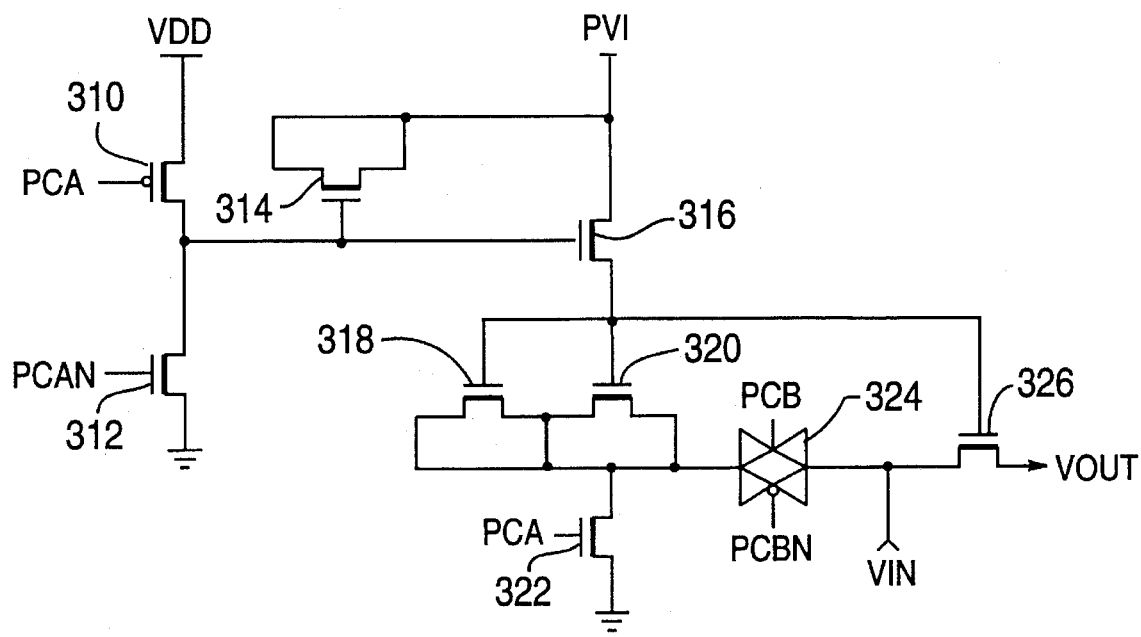
FIG. 3 is a schematic diagram of a constant impedance sampling switch suitable for use in the comparator circuit shown in FIG. 2.

FIG. 3 is a schematic diagram of circuitry suitable for use as the constant impedance sampling switch (CISS) 210. Identical circuitry may also be used for the switch 240. The constant impedance switches 210 and 240 replace transmission gates for gating the input signals VIN and VINR onto the respective notes VSUM and VSUMR.

A transmission gate is a PMOS transistor and an NMOS transistor having common source and drain connections. Complementary control potentials are applied to the gate electrodes of the PMOS and NMOS devices such that a conductive path exists for the signal being transmitted regardless of the instantaneous signal voltage. As is well known, there is a threshold gate to source voltage ($V_{GS}$) below which MOS transistors do not conduct. When $V_{GS}$ is well above the threshold voltage, the transistor exhibits a linear impedance. When, however, $V_{GS}$ is close to the threshold voltage, the transistor exhibits a non-linear impedance. By carefully selecting the size ratio between the NMOS and PMOS devices, the total impedance due to the parallel combination of the two devices can be made relatively constant when both devices are above their threshold voltages. This constant impedance, however, is generally restricted to a relatively small range around 2.5 volts. For signals outside of this range, the paired devices may exhibit non-linear impedance. This non-linear impedance produces harmonic distortion in the signal that is being passed by the transmission gate.

The circuit shown in FIG. 3 avoids this harmonic distortion by providing a sampling switch that has a substantially constant impedance regardless of the amplitude of the signal being sampled. In summary, signal VIN is selectively passed (sampled) by the NMOS transistor 326. The gate electrode of this transistor is controlled such that, when the transistor is in its conductive state, $V_{GS}$ is held at a nearly constant value, close to $V_{DD}$, independent of the instantaneous potential of the signal VIN being passed by the transistor 326.

The switch is controlled by signals PVI, PCA, PCAN, PCB and PCBN. The signal PVI is generated by the circuitry shown in FIG. 2a. The signals PCA, PCAN, PCB and PCBN are generated, from the signal PVI by the circuitry shown in FIG. 2c.

Referring to FIG. 3, when the control signal PVI is logic-zero (e.g. 0 volts), the signal PCA is logic-one (e.g. 5 volts) and the signal PCB is logic-zero. In this state, transistors 310 and 322 are conductive and transistor 312 is non-conductive, accordingly, the gate electrode of transistor 316, and the capacitor formed by transistor 314 are charged to a potential substantially equal to $V_{DD}-V_{tn}$ (e.g. 4 volts, where $V_{tn}$ is the threshold voltage for an NMOS transistor). This renders transistor 316 conductive and, since PVI is logic-zero, discharges the capacitor formed by the transistors 318 and 320 and the gate electrode of transistor 326 to a logic-zero state. In addition, because PCB is logic-zero, the transmission gate 324 is non-conductive and VIN is completely isolated from VOUT.

A positive-going transition of PVI begins a timed switching sequence in which, 2 ns after PVI has become logic-one, PCA becomes logic-zero and, after another 2 ns, PCB becomes logic-one. As PVI becomes logic-one, the capacitor 314 causes the gate electrode of transistor 316 to be at a potential of approximately 9 volts and transistor 316 remains conductive. The logic-one signal passed by the transistor 316 charges the capacitor formed by the transistors 318 and 320 and the gate electrode of the transistor 326 to approximately 5 volts. After 2 ns, when PCA becomes logic-zero, transistor 322 becomes non-conductive, isolating the bottom terminal of the capacitor formed by the transistors 318 and 320. At the same time, transistor 312 becomes conductive and the capacitor 314 is discharged, rendering transistor 316 non-conductive. After a further 2 ns, the signal PCB becomes logic-one rendering the transmission gate 324 conductive, connecting the bottom of the capacitor 318, 320 to the input signal VIN.

Due to the charge stored on the capacitor 318, 320, the gate electrode of transistor 326 is "bootstrapped" to a potential approximately equal to VIN +5 volts. Because the gate-to-source voltage for the transistor 326 is held at a fixed value by the storage capacity of the capacitor 318, 320, the impedance of the switching transistor 326 remains nearly constant for a wide range of values of the input signal VIN.

Thus the constant impedance sampling switches 210 and 240 pass the respective signals VIN and VINR substantially free of any harmonic distortion during the time between the positive-going transition of clock phase P3 and the positive-going transition of clock phase P4, when the signal PVI is logic-one.

Figures 4, 4A:
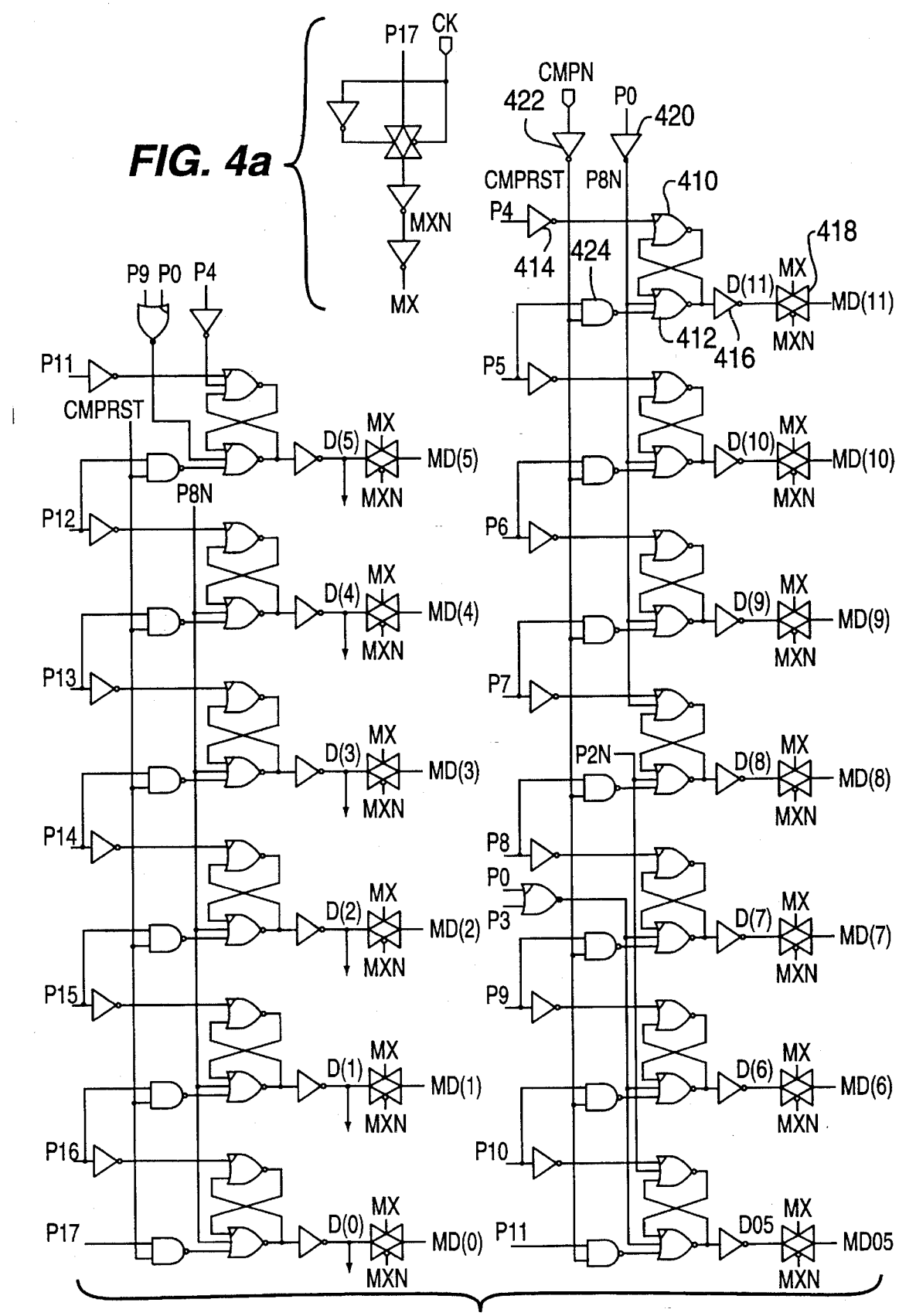
FIG. 4 is a logic diagram, partly in schematic diagram form, of a successive approximation register suitable for use in one of the ADCs shown in FIG. 1.

FIG. 4 shows an exemplary embodiment of the SAR 122 of FIG. 1. The SAR includes 13 essentially identical circuits, corresponding to the 12-bits of data plus one offset bit. For convenience, the circuits which hold the values in the more significant bit positions, D(6) to D(11), are shown on the right of the drawing, and the circuits which hold the values in the less significant bit positions, D(0) to D(5), are shown on the left. The circuit which holds the value D06 is for the offset bit, described below.

The circuit that holds the value of the most significant bit, D(11) includes a latch circuit formed by cross-coupled NAND gates 410 and 412. In this configuration, the latch input terminal to gate 410 is the inverted set (S') input, the latch input terminal to gate 412 is the inverted reset (R') input and the output signal provided by gate 412 is the inverted state of the latch (Q'). The output terminal of gate 412 is connected to an inverter 416, which provides the value D(11) the state of the most significant bit held by the SAR 122. The latch circuit is set, prior to storing the digitized value of bit D(11), by an inverted version of clock phase P4 applied to the S' input terminal of NAND gate 410 via an inverter 414. After the pulse of phase P4, D(11) is logic-one.

The output signal, CMPN, of the comparator 120 is applied to an inverter 422 which, in turn provides the signal CMPRST to one input terminal of the NAND gate 424. The other input terminal is coupled to receive the clock phase P5. When a pulse of phase P5 occurs, the output signal provided by the NAND gate 424 is an inverted version of the signal CMPRST. If this inverted signal is logic-one, then the latch is set and the value of D(11) becomes logic-one. If the output value provided by gate 424 is logic-zero, however, then the latch is reset and the value of D( 11 ) becomes logic-zero.

The latch which holds bit D(11) is initially reset by phase P0 which is inverted and applied to the R' input terminal of NAND gate 412. The latches which hold bits D(10), D(9), D(7), D(6), D06, and D(5) through D(0) are also initially reset by phase P0. The latch which holds bit D(8) is initially set by phase P0 and then is reset by a signal P2N which is an inverted version of phase P2. The signal P2N also resets the latches which hold bits D(7), D(6) and the offset bit, D06. In addition to being reset by phase P0, the latches which hold bits D(7), D(6) and D06 are reset by phase P3, and the latch which holds bit D(5) is reset by phase P9.

Except for these differing set and reset signals, the latches which hold each of the bits D(10) through D(O) and the offset bit DO6 operate in the same manner as the latch which holds bit D(11). Each of the latches which holds bits D(11) through D(O) and the offset bit DO6 is connected to a transmission gate which is driven by the complementary signals MX and MXN. As shown in FIG. 4a, these signals are generated from phase P17. When these signals are applied to the transmission gates, the respective bits of the digital values are read from the SAR 122 as the bits MD(11) through MD(O). In addition, the offset bit is provided as the signal MDO6. These 13 bits are provided to a multiplexer 132 which directs the bits to a format converter 134. The format converter 134, which is described in detail with reference to FIG. 5, converts the 13-bit value into a 12-bit output value of the ADC shown in FIG. 1.

Table 2 illustrates the setting and resetting of the SAR bits D(11) through D(O) responsive to the different clock phases. In this Table, the letter V is used to indicate that the SAR bit is set to its value based on the digitized analog value.

TABLE 2

|    | D(11) | D(10) | D(9) | D(8) | D(7) | D(6) | D(6) | D(5) | D(4) | D(3) | D(2) | D(1) | D(0) |
|----|-------|-------|------|------|------|------|------|------|------|------|------|------|------|
| P0  | 0 | 0 | 0 | 1 | 0 | 0 | 0 | 0 | 0 | 0 | 0 | 0 | 0 |
| P1  | 0 | 0 | 0 | 1 | 0 | 0 | 0 | 0 | 0 | 0 | 0 | 0 | 0 |
| P2  | 0 | 0 | 0 | 0 | 1 | 1 | 1 | 0 | 0 | 0 | 0 | 0 | 0 |
| P3  | 0 | 0 | 0 | 0 | 0 | 0 | 0 | 0 | 0 | 0 | 0 | 0 | 0 |
| P4  | 1 | 0 | 0 | 0 | 0 | 0 | 0 | 1 | 0 | 0 | 0 | 0 | 0 |
| P5  | V | 1 | 0 | 0 | 0 | 0 | 0 | 1 | 0 | 0 | 0 | 0 | 0 |
| P6  | V | V | 1 | 0 | 0 | 0 | 0 | 1 | 0 | 0 | 0 | 0 | 0 |
| P7  | V | V | V | 1 | 0 | 0 | 0 | 1 | 0 | 0 | 0 | 0 | 0 |
| P8  | V | V | V | V | 1 | 0 | 0 | 1 | 0 | 0 | 0 | 0 | 0 |
| P9  | V | V | V | V | V | 1 | 0 | 0 | 0 | 0 | 0 | 0 | 0 |
| P10 | V | V | V | V | V | V | 1 | 0 | 0 | 0 | 0 | 0 | 0 |
| P11 | V | V | V | V | V | V | V | 1 | 0 | 0 | 0 | 0 | 0 |
| P12 | V | V | V | V | V | V | V | V | 1 | 0 | 0 | 0 | 0 |
| P13 | V | V | V | V | V | V | V | V | V | 1 | 0 | 0 | 0 |
| P14 | V | V | V | V | V | V | V | V | V | V | 1 | 0 | 0 |
| P15 | V | V | V | V | V | V | V | V | V | V | V | 1 | 0 |
| P16 | V | V | V | V | V | V | V | V | V | V | V | V | 1 |
| P17 | V | V | V | V | V | V | V | V | V | V | V | V | V |

As shown in Table 2, each of the ADCs 110, shown in FIG. 1 sets a bit in the SAR corresponding to the next bit to be digitized and then compares the analog value that is generated from the partial digital word with that bit set to the input analog value, VIN. If the input value is less than the value generated from the SAR, the bit is reset, otherwise it remains set.

The logic-one values applied via D(5) phases P4 through P8 are added to cause the SAR to initially under-predict the value of the analog input signal VIN. This increases the speed of the comparator when the higher-order bits are being determined by temporarily reducing the level of accuracy to be on the order of the value of D(5). Once these bits have been determined, D(5) is reset to logic-zero to ensure that a final accurate digital value is produced. The extra state D06 is used to compensate for any temporary errors that may be caused by initially setting D(5) to logic-one.

The extra weight assigned to the bit of position 5 of the register is equal to $1/128$ VFS. This extra weight is used as offset compensation to enable the comparator to operate at higher speed than it would without the extra weight. Because the time required for the charging to a voltage by a resistance-capacitance (RC) network is determined by the RC time constant, the voltage at the nodes VSUM and VSUMR do not instantly change to the charging voltage. There is a delay called "settling time", and it is related to the RC time constant and to the magnitude of the voltage change. By initially adding a small "offset" voltage into the analog voltage DA2, during the cycles that the higher values of the MSBs (i.e. D(11) through D(8)) are being determined, comparator 40 can operate accurately at a rate faster than the required settling time would otherwise permit. That is, the comparator, by virtue of this small compensating voltage (temporarily added to analog voltage DA2), can make an accurate determination of these higher value bits at a higher speed than would be possible if the comparator were delayed in its sampling by the full amount of the settling time.

As the voltage change at node VSUM (see equation (1)) becomes smaller and smaller, meaning that more and more "bits" have been determined and stored into the SAR 122, the settling time decreases. At a suitable point in the operation of the SAR 122 the offset compensating voltage is removed, and the comparator 122 still operates accurately at the high speed at which it is being clocked.

When the comparator 122 is comparing the potentials developed at the nodes VSUM and VSUMR sooner than the settling time would otherwise permit, the comparator (without the offset potential) may produce an erroneous comparison (settling time error). For example, if the input voltage at the terminal is greater than the binary value "½", but the comparator errs so that "½" is not included in the partial sum of the binary digits, then the maximum binary value of the remaining digits in the partial sum will always be less than "½". On the other hand, if the input voltage is less than the value "½", but the comparator errs so that "½" is included in the partial sum, then there is no way to reduce the partial sum using lower order bit values.

Settling time errors are avoided by choosing an appropriate value of offset voltage (VO). The value of VO is relatively small (e.g., $1/64$ $V_{FS}$), but is large enough so that in determining the higher order bits (where the voltage changes on the node VSUM may be relatively large and hence settling times longer) settling time is compensated for. By adding a voltage VO/2 (i.e. a voltage corresponding to D(5)) to the analog voltage DA2, the weighted value for the bits contributing to the partial sum in SAR 122 converges to VIN−VO/2.

After determining the partial sum for bits which are weighted with values greater than VO, the VO/2 offset on analog voltage DA2 is removed (i.e. bit D(5) of the SAR 122 is reset), and an extra clock cycle (D06) is provided.

This extra cycle enables the comparator 40 to determine whether the weighted value of the offset voltage VO should be added to the partial sum represented by the partial value in the SAR 122 or left out. If added, then the error in the partial value is zero. If left out, the error is −VO/2. Then on the next cycle, the next bit with a weighted value of VO/2 is either be left out or added to the partial value. If added, the error of −VO/2 of the previous sum will be corrected; if left out no error needed to be corrected. In either case, VIN, without offset error, is now represented by the partial value stored in the SAR 122. The remaining lower order bits of the partial sum are then determined in order to obtain the N+1 bit value of VIN.

In the SAR 122, the voltage VO has a binary weight represented by D(6) ($1/64$ th), and VO/2 has the binary weight of D(5) ($1/128$ th). A bit DO6 is either added or not at phase P10 depending on whether the comparator error is zero or −VO/2. Thereafter, because settling time is no longer a concern, as explained above, the comparator 40 continues on its regular clock cycle in determining the remaining bits without any offset.

Figure 6:
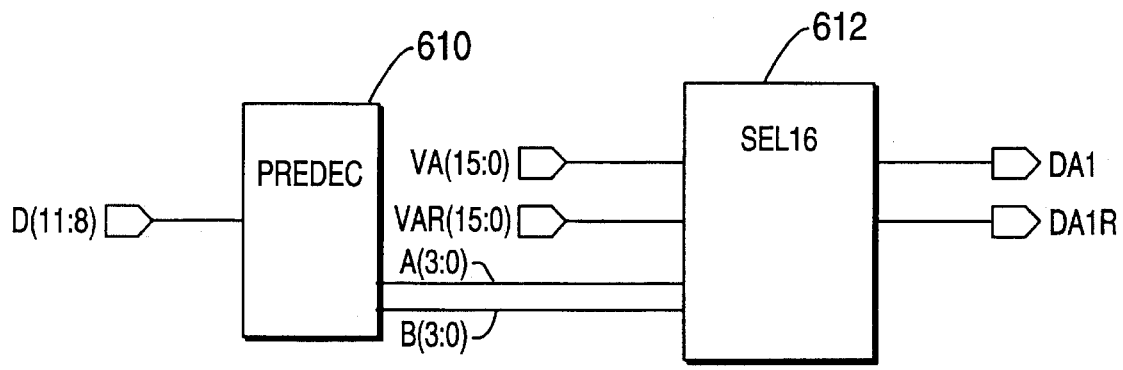
FIG. 6 is a block diagram of a first four-bit DAC suitable for use in one of the ADCs shown in FIG. 1.
Figure 7:
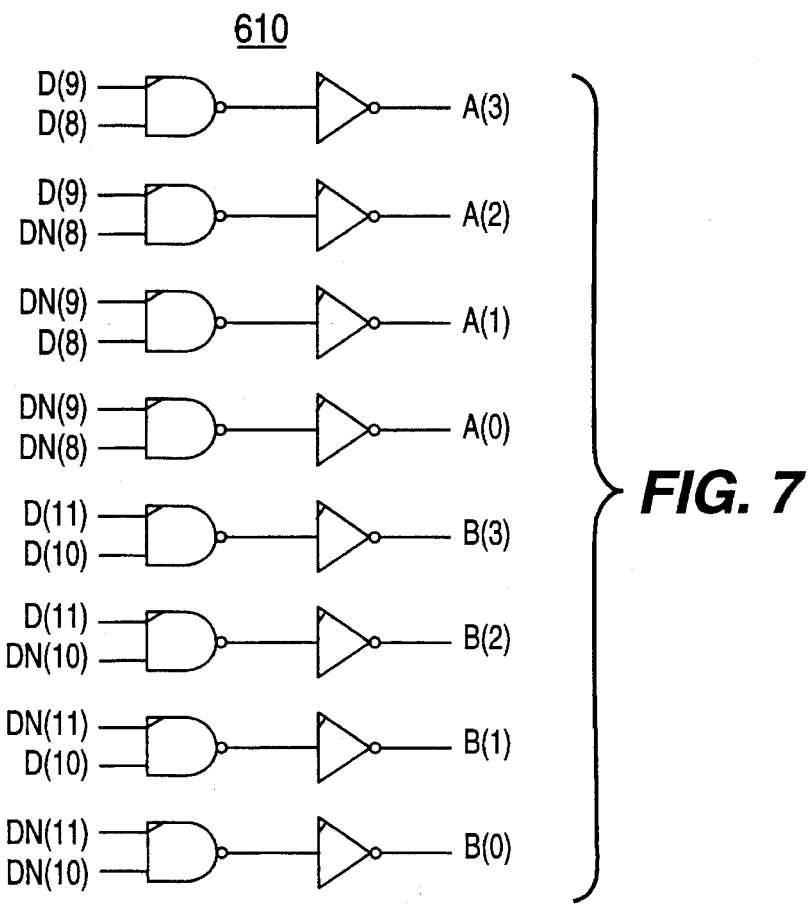
FIG. 7 is a logic schematic diagram of circuitry suitable for use in the DAC shown in FIG. 6.

In FIG. 6, an exemplary embodiment of the MSB DAC 124 is shown in FIG. 1. In this Figure, the input binary code of the four MSB values D(11), D(10) and D(9) and D(8) is converted into the analog values DA1 and DA1R which are applied to the comparator shown in FIG. 2. The circuitry shown in FIG. 6 includes a predecoder 610 and a selection circuit 612. The predecoder 610 generates eight digital values, A(0) through A(3) (hereinafter A(0:3)) and B(0) through B(3) (hereinafter B(0:3)) from the values D(11), D(10), D(9) and D(8) and from the logical complements of these values, DN(11), DN(10), DN(9) and DN(8). The predecoder circuitry which generates these values is shown in FIG. 7. The values A(0:3) and B(0:3) are applied to the selection circuit 612 which is shown in FIGS. 8a, 8b and 8c. This circuit includes a logic circuit, 810 which converts the eight signals A(0:3) and B(0:3) into 16 control signals, T(0) through T(15) (hereinafter T(0:15)). These signals, in turn, are applied to transmission gates, as shown in FIGS. 8b and 8c to produce the analog signals DA1 and DA1R. The selection circuit 612 is a pair of 16-to-1 multiplexers, each of which selects one of 16 voltage signals, VA(0) through VA(15) or VAR(0) through VAR(15) to provide as the respective output signal DA1 and DA1R.

The operation of the predecoder 610 and the logic circuitry of the selection circuit may be summarized by Table 3 which translates the input data values D(11) through D(8) into values for the control variables T(0:15). For the sake of brevity, the generation of the inverse signals, TN(0:15) is not shown. These signals are the logical inverse of the respective signals T(0:15).

Figure 9:
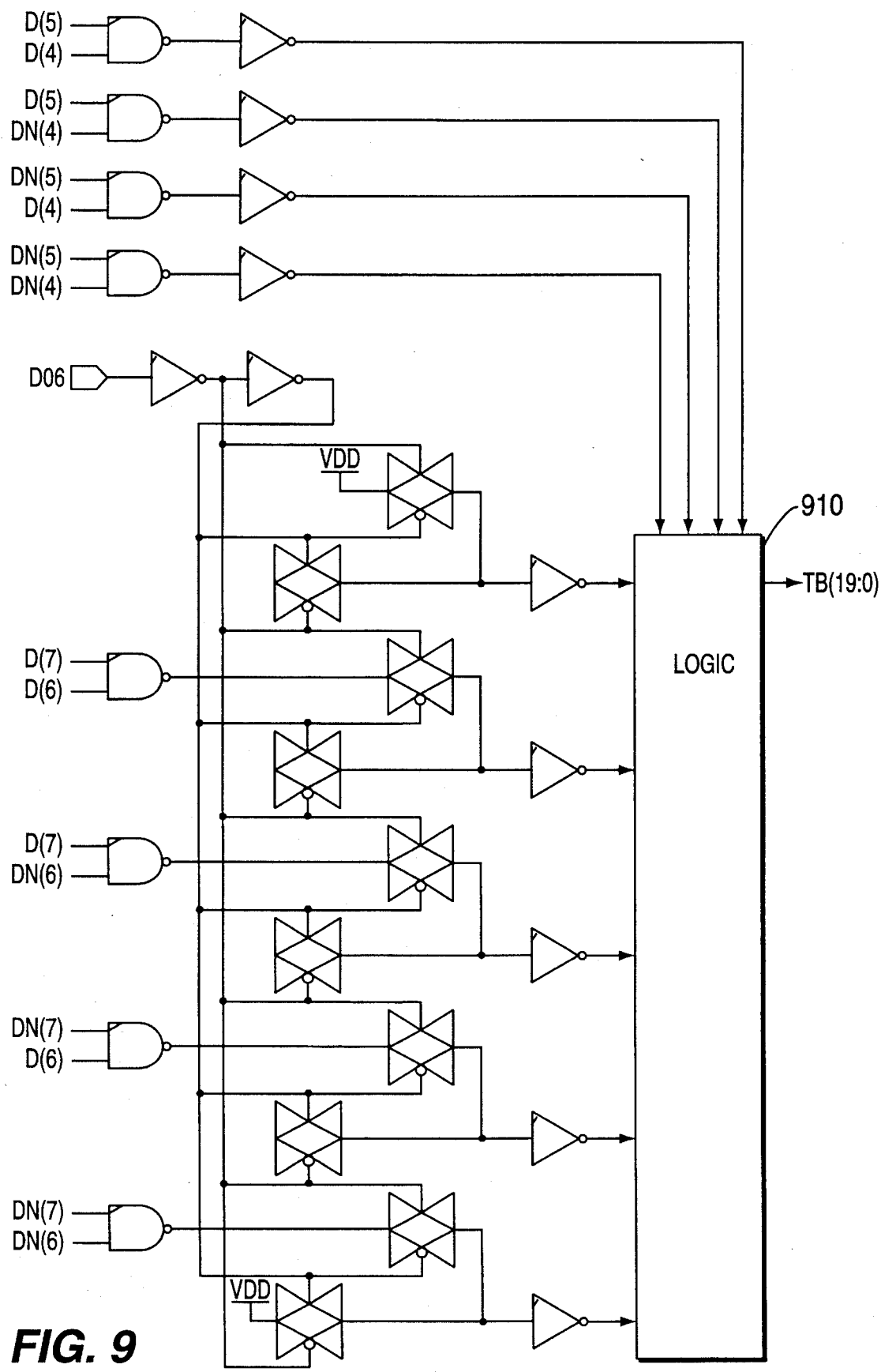
FIGS. 9, 10a and 10b are logic diagrams and schematic diagrams of a second four-bit DAC suitable for use in one of the ADCs shown in FIG. 1.
Figure 10A:
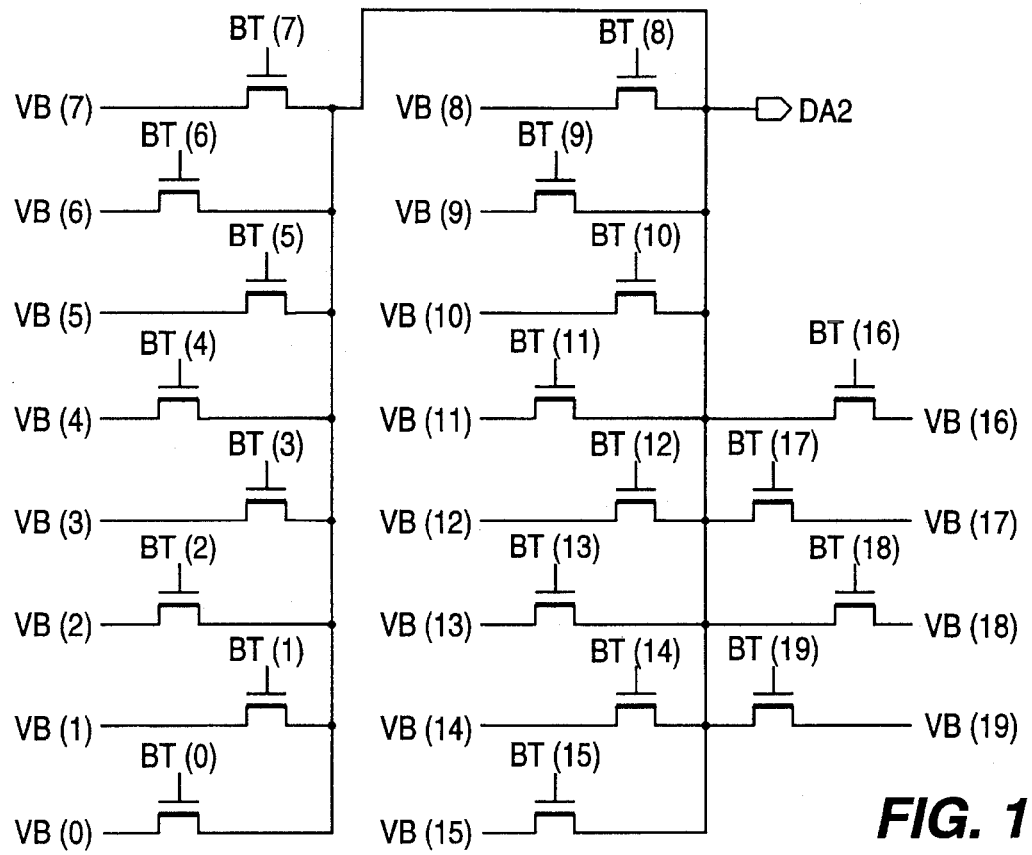
Figure 10B:
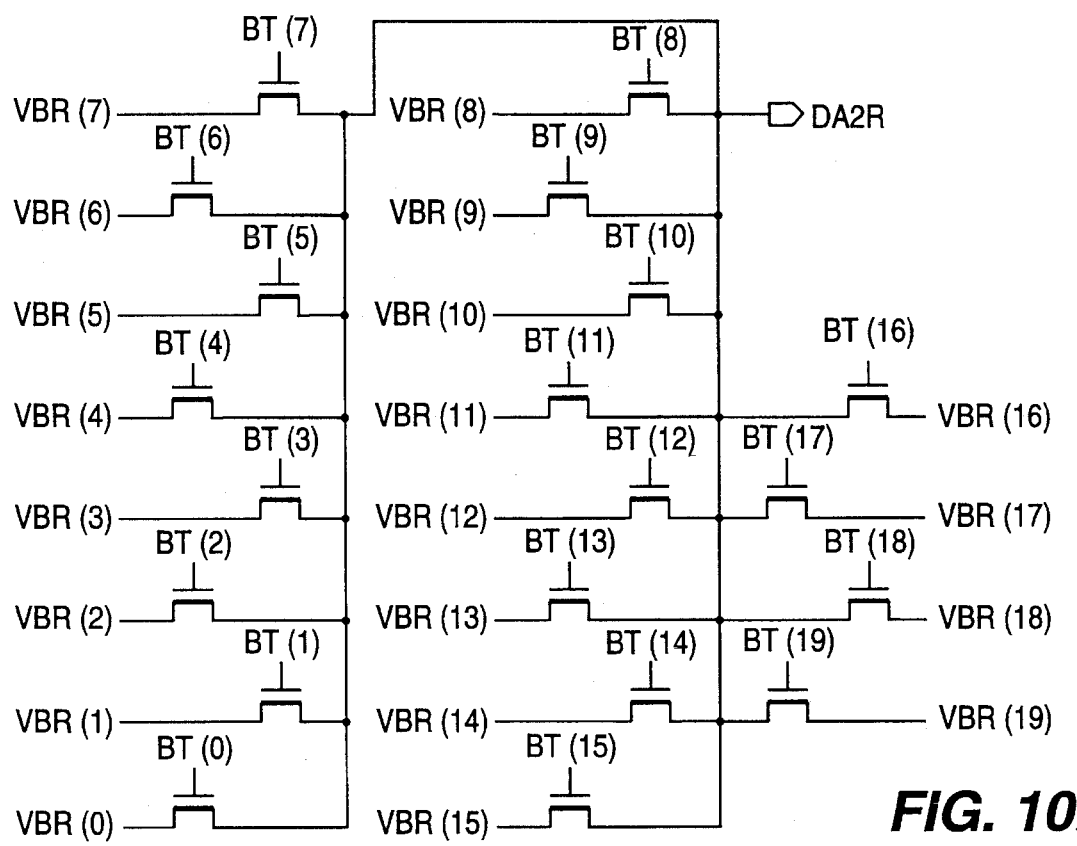

As shown in FIGS. 8b the analog potential DA1 is generated by providing one of several voltages VA(0) through VA(15) based on the values of the control variables T(0:15). FIG. 8c shows identical circuitry for providing the analog potential DA1R as one of several voltages VAR(0) through VAR(15). The generation of these voltages is described in detail below with reference to FIGS. 15, 16 and 17. FIGS. 9, 10a and 10b are schematic diagrams, partially in block diagram form, of circuitry suitable for use as the DAC 126 which produces the analog potentials DA2 and DA2R. As with the DAC 124, the DAC shown in FIGS. 9, 10a and 10b includes logic circuitry, shown in FIG. 9, that generates control signals, TB0 through TB19 (hereinafter TB(0:19)) which control a plurality of transmission gates, shown in FIGS. 10a and 10b, to produce the analog potentials DA2 and DA2R.

The operation of the logic circuitry shown in FIG. 9 is summarized by Table 4.

TABLE 3

| D(11) | D(10) | D(9) | D(8) | T15 | T14 | T13 | T12 | T11 | T10 | T9 | T8 | T7 | T6 | T5 | T4 | T3 | T2 | T1 | T0 |
|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 | 1 |
| 0 | 0 | 0 | 1 | 0 | 0 | 0 | 0 | 0 | 0 | 0 | 0 | 0 | 0 | 0 | 0 | 0 | 0 | 1 | 0 |
| 0 | 0 | 1 | 0 | 0 | 0 | 0 | 0 | 0 | 0 | 0 | 0 | 0 | 0 | 0 | 0 | 0 | 1 | 0 | 0 |
| 0 | 0 | 1 | 1 | 0 | 0 | 0 | 0 | 0 | 0 | 0 | 0 | 0 | 0 | 0 | 0 | 1 | 0 | 0 | 0 |
| 0 | 1 | 0 | 0 | 0 | 0 | 0 | 0 | 0 | 0 | 0 | 0 | 0 | 0 | 0 | 1 | 0 | 0 | 0 | 0 |
| 0 | 1 | 0 | 1 | 0 | 0 | 0 | 0 | 0 | 0 | 0 | 0 | 0 | 0 | 1 | 0 | 0 | 0 | 0 | 0 |
| 0 | 1 | 1 | 0 | 0 | 0 | 0 | 0 | 0 | 0 | 0 | 0 | 0 | 1 | 0 | 0 | 0 | 0 | 0 | 0 |
| 0 | 1 | 1 | 1 | 0 | 0 | 0 | 0 | 0 | 0 | 0 | 0 | 1 | 0 | 0 | 0 | 0 | 0 | 0 | 0 |
| 1 | 0 | 0 | 0 | 0 | 0 | 0 | 0 | 0 | 0 | 0 | 1 | 0 | 0 | 0 | 0 | 0 | 0 | 0 | 0 |
| 1 | 0 | 0 | 1 | 0 | 0 | 0 | 0 | 0 | 0 | 1 | 0 | 0 | 0 | 0 | 0 | 0 | 0 | 0 | 0 |
| 1 | 0 | 1 | 0 | 0 | 0 | 0 | 0 | 0 | 1 | 0 | 0 | 0 | 0 | 0 | 0 | 0 | 0 | 0 | 0 |
| 1 | 0 | 1 | 1 | 0 | 0 | 0 | 0 | 1 | 0 | 0 | 0 | 0 | 0 | 0 | 0 | 0 | 0 | 0 | 0 |
| 1 | 1 | 0 | 0 | 0 | 0 | 0 | 1 | 0 | 0 | 0 | 0 | 0 | 0 | 0 | 0 | 0 | 0 | 0 | 0 |
| 1 | 1 | 0 | 1 | 0 | 0 | 1 | 0 | 0 | 0 | 0 | 0 | 0 | 0 | 0 | 0 | 0 | 0 | 0 | 0 |
| 1 | 1 | 1 | 0 | 0 | 1 | 0 | 0 | 0 | 0 | 0 | 0 | 0 | 0 | 0 | 0 | 0 | 0 | 0 | 0 |
| 1 | 1 | 1 | 1 | 1 | 0 | 0 | 0 | 0 | 0 | 0 | 0 | 0 | 0 | 0 | 0 | 0 | 0 | 0 | 0 |

TABLE 4

| D(7) | D(6) | D06 | D(5) | D(4) | TB19 | TB18 | TB17 | TB16 | TB15 | TB14 | TB13 | TB12 | TB11 | TB10 | TB9 | TB8 | TB7 | TB6 | TB5 | TB4 | TB3 | TB2 | TB1 | TB0 |
|---|---|---|---|---|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 |
| 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 1 | 0 |
| 0 | 0 | 0 | 1 | 0 | 0 | 0 | 0 | 0 | 0 | 0 | 0 | 0 | 0 | 0 | 0 | 0 | 0 | 0 | 0 | 0 | 0 | 1 | 0 | 0 |
| 0 | 0 | 0 | 1 | 1 | 0 | 0 | 0 | 0 | 0 | 0 | 0 | 0 | 0 | 0 | 0 | 0 | 0 | 0 | 0 | 0 | 1 | 0 | 0 | 0 |
| 0 | 0 | 1 | 0 | 0 | 0 | 0 | 0 | 0 | 0 | 0 | 0 | 0 | 0 | 0 | 0 | 0 | 0 | 0 | 0 | 1 | 0 | 0 | 0 | 0 |
| 0 | 0 | 1 | 0 | 1 | 0 | 0 | 0 | 0 | 0 | 0 | 0 | 0 | 0 | 0 | 0 | 0 | 0 | 0 | 1 | 0 | 0 | 0 | 0 | 0 |
| 0 | 0 | 1 | 1 | 0 | 0 | 0 | 0 | 0 | 0 | 0 | 0 | 0 | 0 | 0 | 0 | 0 | 0 | 1 | 0 | 0 | 0 | 0 | 0 | 0 |
| 0 | 0 | 1 | 1 | 1 | 0 | 0 | 0 | 0 | 0 | 0 | 0 | 0 | 0 | 0 | 0 | 0 | 1 | 0 | 0 | 0 | 0 | 0 | 0 | 0 |
| 0 | 1 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 |
| 0 | 1 | 0 | 0 | 1 | 0 | 0 | 0 | 0 | 0 | 0 | 0 | 0 | 0 | 0 | 1 | 0 | 0 | 0 | 0 | 0 | 0 | 0 | 0 | 0 |
| 0 | 1 | 0 | 1 | 0 | 0 | 0 | 0 | 0 | 0 | 0 | 0 | 0 | 0 | 1 | 0 | 0 | 0 | 0 | 0 | 0 | 0 | 0 | 0 | 0 |

TABLE 4-continued

| D(7) | D(6) | D06 | D(5) | D(4) | TB19 | TB18 | TB17 | TB16 | TB15 | TB14 | TB13 | TB12 | TB11 | TB10 | TB9 | TB8 | TB7 | TB6 | TB5 | TB4 | TB3 | TB2 | TB1 | TB0 |
|---|---|---|---|---|---|---|---|---|---|---|---|---|---|---|---|---|---|---|---|---|---|---|---|---|
| 0 | 1 | 0 | 1 | 1 | 0 | 0 | 0 | 0 | 0 | 0 | 0 | 0 | 0 | 0 | 0 | 0 | 1 | 0 | 0 | 0 | 0 | 0 | 0 | 0 |
| 0 | 1 | 1 | 0 | 0 | 0 | 0 | 0 | 0 | 0 | 0 | 0 | 0 | 0 | 0 | 0 | 1 | 0 | 0 | 0 | 0 | 0 | 0 | 0 | 0 |
| 0 | 1 | 1 | 0 | 1 | 0 | 0 | 0 | 0 | 0 | 0 | 0 | 0 | 0 | 0 | 1 | 0 | 0 | 0 | 0 | 0 | 0 | 0 | 0 | 0 |
| 0 | 1 | 1 | 1 | 0 | 0 | 0 | 0 | 0 | 0 | 0 | 0 | 0 | 0 | 1 | 0 | 0 | 0 | 0 | 0 | 0 | 0 | 0 | 0 | 0 |
| 0 | 1 | 1 | 1 | 1 | 0 | 0 | 0 | 0 | 0 | 0 | 0 | 0 | 1 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 |
| 1 | 0 | 0 | 0 | 1 | 0 | 0 | 0 | 0 | 0 | 0 | 0 | 0 | 0 | 1 | 0 | 0 | 0 | 0 | 0 | 0 | 0 | 0 | 0 | 0 |
| 1 | 0 | 0 | 1 | 0 | 0 | 0 | 0 | 0 | 0 | 0 | 0 | 0 | 1 | 0 | 0 | 0 | 0 | 0 | 0 | 0 | 0 | 0 | 0 | 0 |
| 1 | 0 | 0 | 1 | 1 | 0 | 0 | 0 | 0 | 0 | 0 | 0 | 1 | 0 | 0 | 0 | 0 | 0 | 0 | 0 | 0 | 0 | 0 | 0 | 0 |
| 1 | 0 | 1 | 0 | 0 | 0 | 0 | 0 | 0 | 0 | 0 | 1 | 0 | 0 | 0 | 0 | 0 | 0 | 0 | 0 | 0 | 0 | 0 | 0 | 0 |
| 1 | 0 | 1 | 0 | 1 | 0 | 0 | 0 | 0 | 0 | 1 | 0 | 0 | 0 | 0 | 0 | 0 | 0 | 0 | 0 | 0 | 0 | 0 | 0 | 0 |
| 1 | 0 | 1 | 1 | 0 | 0 | 0 | 0 | 0 | 1 | 0 | 0 | 0 | 0 | 0 | 0 | 0 | 0 | 0 | 0 | 0 | 0 | 0 | 0 | 0 |
| 1 | 0 | 1 | 1 | 1 | 0 | 0 | 0 | 1 | 0 | 0 | 0 | 0 | 0 | 0 | 0 | 0 | 0 | 0 | 0 | 0 | 0 | 0 | 0 | 0 |
| 1 | 1 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 |
| 1 | 1 | 0 | 0 | 1 | 0 | 0 | 0 | 0 | 0 | 1 | 0 | 0 | 0 | 0 | 0 | 0 | 0 | 0 | 0 | 0 | 0 | 0 | 0 | 0 |
| 1 | 1 | 0 | 1 | 0 | 0 | 0 | 0 | 0 | 1 | 0 | 0 | 0 | 0 | 0 | 0 | 0 | 0 | 0 | 0 | 0 | 0 | 0 | 0 | 0 |
| 1 | 1 | 0 | 1 | 1 | 0 | 0 | 0 | 1 | 0 | 0 | 0 | 0 | 0 | 0 | 0 | 0 | 0 | 0 | 0 | 0 | 0 | 0 | 0 | 0 |
| 1 | 1 | 1 | 0 | 0 | 0 | 0 | 0 | 1 | 0 | 0 | 0 | 0 | 0 | 0 | 0 | 0 | 0 | 0 | 0 | 0 | 0 | 0 | 0 | 0 |
| 1 | 1 | 1 | 0 | 1 | 0 | 0 | 1 | 0 | 0 | 0 | 0 | 0 | 0 | 0 | 0 | 0 | 0 | 0 | 0 | 0 | 0 | 0 | 0 | 0 |
| 1 | 1 | 1 | 1 | 0 | 0 | 1 | 0 | 0 | 0 | 0 | 0 | 0 | 0 | 0 | 0 | 0 | 0 | 0 | 0 | 0 | 0 | 0 | 0 | 0 |
| 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 |

The logic function illustrated by Table 4, by the value DO6 compensates for the offset which is added via the D(5) position in order to cause the signal applied to the capacitance at the input to the auto-zero comparator 110, shown in FIG. 1, to settle faster. Duplicated states of the signals TB(O) through TB(19) represent digital values which may be produced in response to the same analog input values.

As shown in FIGS. 10a and 10b, the signals TB(0:19) are applied as control signals to respectively different transmission gates which are coupled to selectively pass respectively different ones of the reference voltages VB(0) through VB(19) produced by the resistor divider network 140, shown in FIG. 1, as the analog output signal DA2. The resistor divider network is described below in detail with reference to FIGS. 15, 16 and 17.

Figure 11:
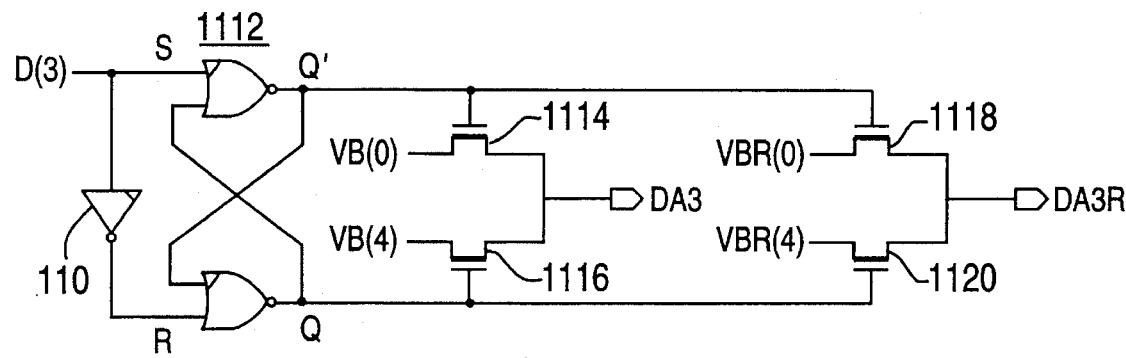
FIGS. 11, 12, 13 and 14 are logic schematic diagrams, partly in schematic diagram form, of one-bit DACs suitable for use in one of the ADCs shown in FIG. 1.
Figure 12:
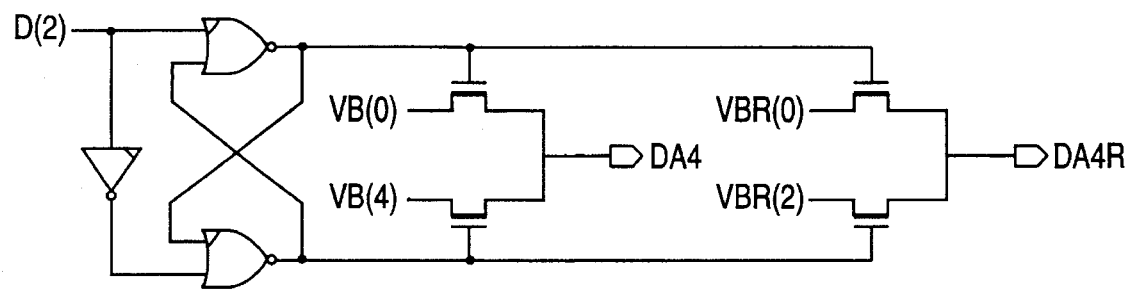
Figure 13:
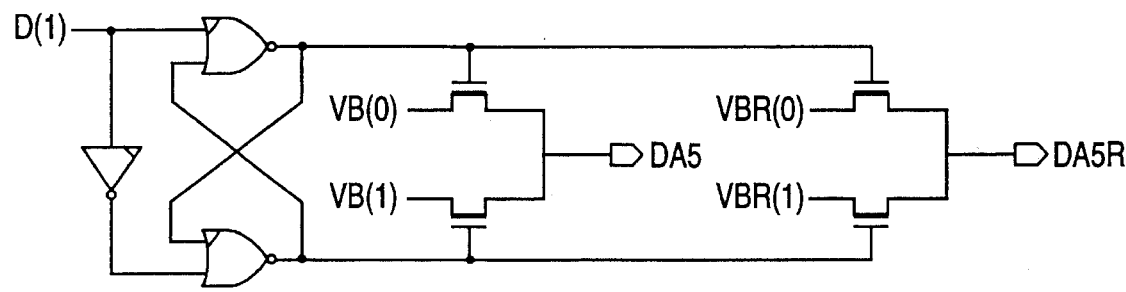
Figure 14:
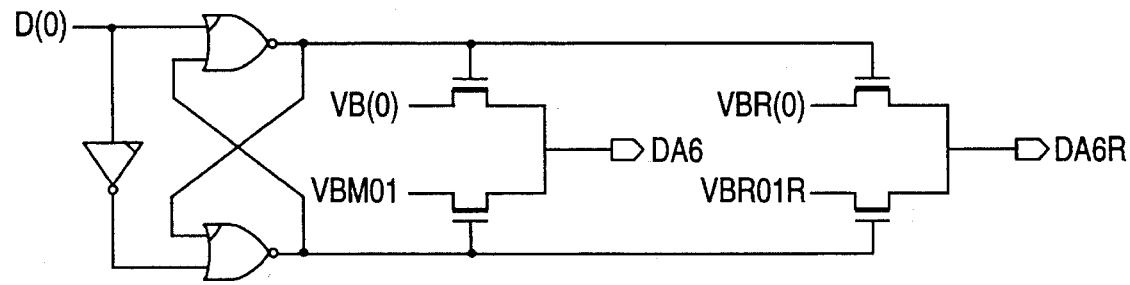

FIGS. 11, 12, 13 and 14 are logic diagrams, partly in schematic diagram form, of one-bit digital-to-analog converters suitable for use as the DACs 128 and 130, shown in FIG. 1. The DACs shown in FIGS. 11 and 12 are paired to form the DAC 128 while the DACs shown in FIGS. 13 and 14 are paired to form the DAC 130. Because these DACs are identical, only one, the DAC shown in FIG. 11 is described in detail. In this Figure, the binary value D(3) from the SAR 122 is applied to the set input terminal of a latch 1112 while an inverted version of the binary value, as provided by an inverter 1110, is applied to the reset input terminal of the latch. The Q output terminal of the latch 1112 is coupled to control two transmission gates 1116 and 1120 while the Q' output terminal of the latch is coupled to control another two transmission gates 1114 and 1118. Gates 1116 and 1120 provide the voltages VB(4) and VBR(4) respectively, as the respective analog potentials DA3 and DA3R, when bit D(3) is logic-one, while the gates 1114 and 1118 provide the voltages VB(0) and VBR(0) as the respective potentials when bit D(3) is logic-zero. The circuits shown in FIGS. 12, 13 and 14 operate in the same manner as the circuit shown in FIG. 11 except that they use different bits of the SAR 122 and provide different voltages when their respective bits are in a logic-one state.

The DAC shown in FIG. 14 passes the reference voltage VBM01 when bit D(0) of the SAR 122 is logic-one. As described below with reference to FIG. 15, the step size between reference voltages VB(1) and VBM01 and between reference voltages VBM01 and VB(0) is one-half of the step size between any two other adjacent taps on the resistor network. This difference in step size compensates for the capacitor 232 of FIG. 1, which is used to couple the signal DA6 to the auto-zero comparator shown in FIG. 2. In the exemplary embodiment of the invention, this capacitor has the same capacitance as the capacitors 226, 238 and 230 which are used to couple the signals DA3, DA4, and DA5 to the comparator 40'. This smaller step size allows the potential provided in response to bit B(0) being set to receive proper weight in the weighted sum produces at node VSUM. The same applies for the voltage VBMR01 and the capacitor 262 which couples the potential DA6R to the node VSUMR.

Figure 15:
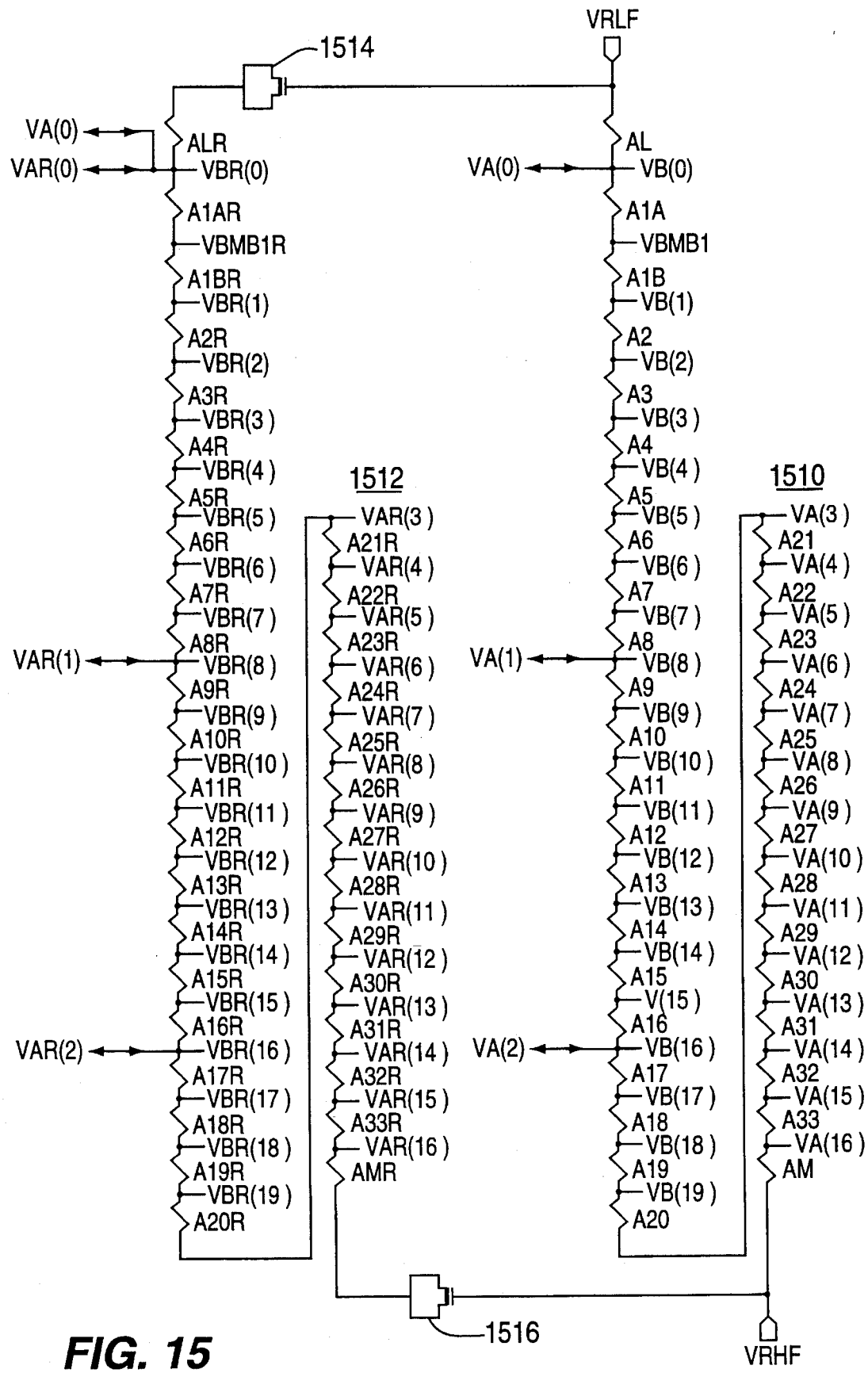
FIG. 15 is a schematic diagram of a reference voltage divider circuit which is suitable for use in the ADC system shown in FIG. 1.

FIG. 15 is a schematic diagram of the two voltage divider networks 1510 and 1512 which are used to generate the voltages VA(0) through VA(16), VB(0) through VB(19), VAR(0) through VAR(16) and VBR(0) through VBR(19). The network 1510 is coupled to divide the difference between a high reference voltage, VRHF, and a low reference voltage, VRLF, to produce the reference voltages VA(0) through VA(16) and VB(0) through VB(19). The network 1512 is capacitively coupled, via the capacitors 1514 and 1516, to the voltage sources VRHF and VRLF to produce the reference voltages VAR(0) through VAR(16) and VBR(0) through VBR(19). In addition, the tap in the network 1512 which produces the reference voltage VAR(0) is connected to the tap in the network 1510 which produces the reference voltage VA(0). Because the network 1512 is capacitively coupled to the reference high source and reference low source, it does not provide direct current (DC) voltages. The reference voltages VAR(0) through VAR(16) and VBR(0) through VBR(19) are non zero only when there is a significant noise signal propagating into the ADC system, for example, through the substrate of the integrated circuit on which the ADC system is formed. Without the network 1512, the signals DAR0 through DAR6 and the summing network VSUMR, these signals would interfere with the operation of the differential circuitry of the ADC system as common mode signals.

To obtain a highly accurate resistor divider, the resistors are desirably implemented in a heavily doped material, such as N+polysilicon and placed on a thick dielectric glass to reduce bottom surface depletion. Additionally, if an N-well resistor is placed under the reference resistor and driven with the same voltage at its ends, then the local normal electric field on the bottom of the reference resistor will be constant.

Exemplary values for the resistors shown in FIG. 15 are shown in Table 5.

TABLE 5

| Resistor | Value |
| --- | --- |
| RL, RLR, RH, RHR | 6 Ω |
| R1A, R1B, R1AR, R1BR | 2 Ω |
| R2–R19 & R2R–R19R | 4 Ω |
| R20, R20R | 20 Ω |
| R21–R33 & R21R–R33R | 32 Ω |

As shown in FIG. 15, the reference voltages VA(0) through VA(16) are generated using a resistor ladder network which includes a series of 32 Ω resistances. The voltages VB(0) through VB(19), on the other hand, are generated using a sub-network of the network which generates the VA reference voltages. This subnetwork is a series connection of 4 Ω resistors which are used, at least in part, to form the 32 Ω resistances used to develop the reference voltages VA(1) through VA(3). The same analysis applies for the return reference voltages VAR(0) through VAR(19) and VBR(0) through VBR(19).

Due to process variations, the resistances of the resistors shown in FIG. 15 may vary from their nominal values, even within a particular network. If left uncorrected, this variation may be sufficient to affect the accuracy of an ADC system which uses this resistor divider network. The exemplary ADC system shown in FIG. I corrects for any variation in resistance using an active compensation circuit shown in FIGS. 16a through 16d and 17a through 17f.

Briefly, this circuit is an autocalibration circuit which periodically measures the voltage difference between each pair of adjacent taps in the network 1510, that produce the VA reference voltages, and then adjusts the resistance of that segment of the ladder network to achieve a substantially exact match among the VA tap difference voltages. There is no similar control of the network 1512 since the reference voltages provided by that network do not include any DC components.

Figure 16A:
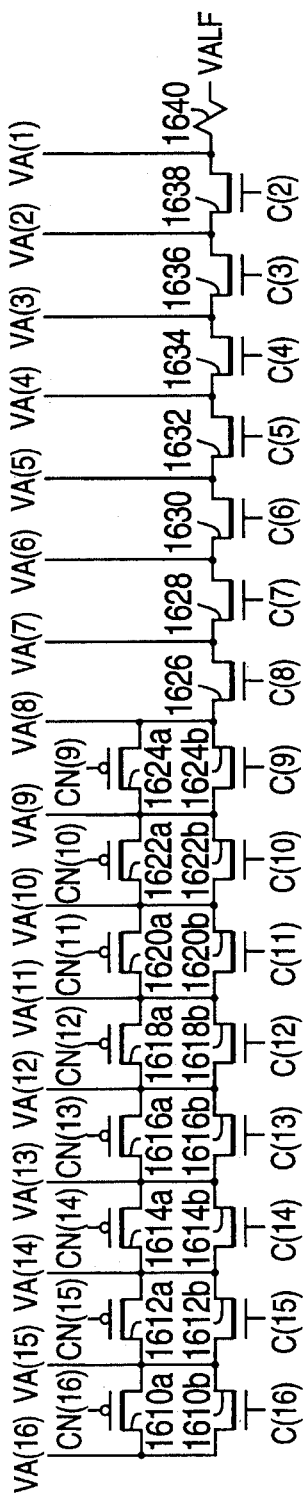
FIGS. 16a, 16b, 16c, 16d and 16e are schematic diagrams, partly in logic schematic diagram form, of control circuitry suitable for use with the reference voltage divider circuit shown in FIG. 15.

The control of the tap resistance is realized by a network of PMOS and NMOS transistors, configured as voltage-controlled resistors, shown in FIG. 16a. In this Figure, the transistors which control the portion of the network that produces the reference voltages VA(8) to VA(16) are implemented as NMOS and PMOS devices that are coupled in parallel. This configuration allows flexibility in the selection of the full-scale reference voltage, VRHF, that is used by the ADC system. The transistors that control the reference voltages VA(1) to VA(8) are respective single NMOS devices. The reference voltages shown in FIG. 16a are the same as those shown in FIG. 15. Accordingly, the transistors 1610a and 1610b control the resistance of resistor R33, while the transistors 1612a and 1612b control the resistance of resistor R32, and so on. The correspondence between the transistors shown in FIG. 16a and the resistors shown in FIG. 15 is shown in Table 6.

TABLE 6

| Transistors | Resistors |
| --- | --- |
| 1610a, 1610b | R33 |
| 1612a, 1612b | R32 |

TABLE 6-continued

| Transistors | Resistors |
| --- | --- |
| 1614a, 1614b | R31 |
| 1616a, 1616b | R30 |
| 1618a, 1618b | R29 |
| 1620a, 1620b | R28 |
| 1622a, 1622b | R27 |
| 1624a, 1624b | R26 |
| 1626 | R25 |
| 1628 | R24 |
| 1630 | R23 |
| 1632 | R22 |
| 1634 | R21–R17 |
| 1636 | R16–R9 |
| 1638 | R8–R1A |

Figure 16C:
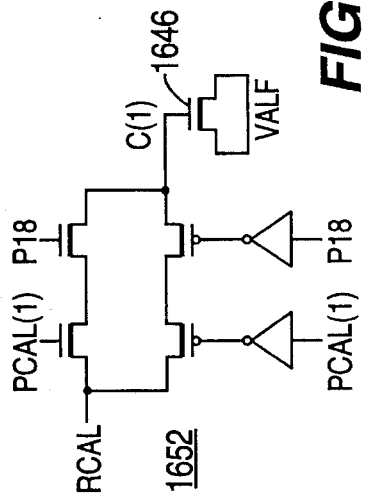
Figure 16B:
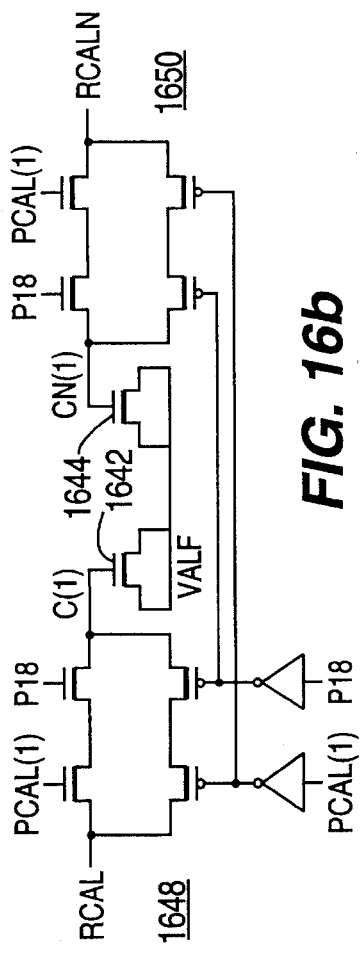

Each of the transistors 1610a through 1638 is controlled by a respective capacitor which is charged by the autocalibration circuit to a controlled potential. The potential applied to the gate electrode of the transistor tends to cause the combined resistance of the resistor spanned by the transistor and the channel of the transistor to match a reference resistance. For the sake of brevity, only two representative capacitors, 1642 and 1644, which may be used to control one of the NMOS PMOS transistor pairs, are shown in FIG. 16b; and a single capacitor, 1646, which may be used to control one of the single NMOS transistors, is shown in FIG. 16c. These capacitors are components of respective integrating low-pass filters 1648, 1650 and 1652 which operate in the same manner as the filters 297 and 298, described above, with reference to FIG. 2. The control circuitry includes eight copies of the circuit shown in FIG. 16b and seven copies of the circuit shown in FIG. 16c.

Figure 16D:
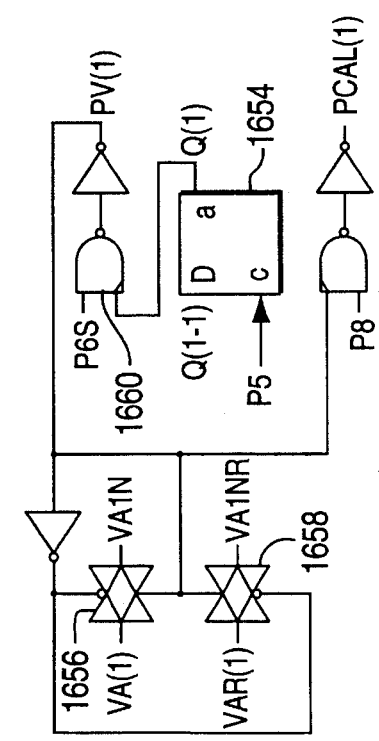
Figure 16E:
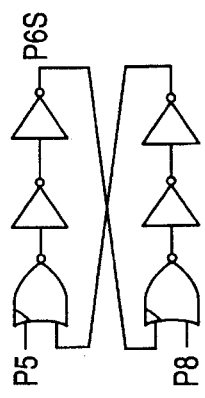

The filters 1648 and 1652 receive signal samples via a signal RCAL synchronous with a clock signal PCAL (I) which is generated by the circuitry shown in FIGS. 16d and 16e. The value I represents one of the eight filters shown in FIG. 16b or one of the seven filters shown in FIG. 16c. Only one clock pulse is applied to only one of the 15 filters in each cycle of 18 clock phases P0 through P17. Responsive to this pulse signal, which occurs between clock phases P5 and P6, a selected one of the 15 filters 1648 and 1652 samples the signal RCAL and then transfers the sample to the respective capacitor 1642 or 1646 synchronous with clock phase P10. In the same way, filter 1650 samples a signal RCALN synchronous with the clock signal PCAL (I) and transfers the sample value to the capacitor 1646 synchronous with clock phase P10.

The circuitry which generates the signals PCAL(I) is a 15 stage circuit, one stage of which is shown in FIG. 16d. This circuit includes a circular shift register formed by D-type flip flops (e.g. flip-flop 1654) connected such that the Q output terminal of one flip-flop is connected to the D input terminal of 5 the next flip-flop. All of the flip-flops are clocked by the clock phase P5. The flip-flops which make up the shift register are connected as a ring and only one flip-flop in the ring has a logic-one state. This state is passed around the ring from one flip-flop 1654 to the next. Whenever one of the flip-flops has the logic-one state value, it produces the signal PCAL (I) for its respective filter 1646 or filters 1648 and 1650. In addition, the circuitry shown in FIG. 16d enables two transmission gates 1656 and 1658 to pass the respective voltages VA(I) and VAR(I), generated from the resistor networks 1510 and 1512, respectively, as the signals VAIN and VAINR. These signals are used by a calibration comparator, described below with reference to FIGS. 17a through 17e.

The circuitry shown in FIG. 16d is controlled by a signal P6S which is generated by the circuitry shown in FIG. 16e.

This signal is logic-one at all times except between the respective positive-going transitions of phases P5 and P6. In this interval, the signal P6S is logic-zero. The circuitry shown in FIG. 16d transfers the signals VAIN and VAINR substantially coincident with the signal P6S. It then generates the signal PCAL(I) substantially coincident with the clock phase P8.

FIGS. 17a and 17b are a schematic diagram of circuitry suitable for use as a comparator which generates the signals RCAL and RCALN from the sampled voltage signal VAIN. FIGS. 17c, 17d and 17e are schematic diagrams of circuits which generate control signals for the circuits shown in FIGS. 17a and 17b. The circuitry shown in FIGS. 17a and 17b includes many of the same elements as the circuitry shown in FIG. 2. Notably absent is any circuitry equivalent to the gain adjust circuit 214, shown in FIG. 2. Briefly, after a bias calibration cycle that spans phases P0 to P3, the circuitry shown in FIG. 17 samples the signals VA(O) and VA(1) to establish a reference potential difference. Next, the circuit samples VAIN, which represents VA(I), and then, after VAIN has switched to become VA(I+1), it again samples VAIN to generate the difference between VA(I+1) and VA(I). The difference between VA(1) and VA(0) is then subtracted from this difference to produce the input signal CVSUM to the differential amplifier 1710. The other input signal to the differential amplifier 1710 is the signal CVSUMR which is generated from the return voltages VAR(0), VAR(1), VAR(I) and VAR(I+1) in L 0 the same manner as the signal CVSUM.

The output signals, A1 and A2, of the differential amplifier 1710 are applied as input signals to a second differential amplifier 1722. This amplifier produces output signals Y1 and Y2 which are applied to a differential latch 1730, shown in FIG. 17b. This latch generates the output signals RCAL and RCALN of the calibration comparator. These signals are used, as described above, by the integrating low-pass filters shown in FIGS. 16b and 16c to generate the control voltages for the network of voltage controlled resistors shown in FIG. 16a.

The following is a detailed description of the generation of the difference potentials at the nodes CVSUM and CVSUMR. Since the sequence of events affecting CVSUMR is the same as that affecting the node CVSUM, only the generation of the difference potential at node CVSUM is described below. The operation of the circuitry shown in FIGS. 17a and 17b in generating the signals BIAS and BIASN during clock phases P0 through P3 is identical to that described above with reference to FIG. 2, and, so, is not described in detail. During phase P0, the reference voltage VA(1) is applied to the left side of capacitor 1714, and, responsive to the signals PVA, PVAN, PVD and PVDN, the left side of capacitor 1712 is charged to VA(O). Shortly before phase P1, responsive to the signals PSMP and PSMPN, generated by the circuitry shown in FIG. 2b, the right sides of capacitors 1712 and 1714 are charged to VREF. As described above, with reference to FIG. 2, this step biases the gate electrodes of the PMOS transistor 1722 a state in which a slight change in gate potential will cause a change in the conductivity of the transistor. Shortly after the positive going transition of phase P1, PVA becomes logic-one and PVB becomes logic-zero. This causes the potential VA(1) to be applied to the left side of capacitor 1712 and the potential VA(0) to be applied to the left side of capacitor 1714. At this stage, the differential contribution of capacitor 1712 to the node CVSUM may be represented by the expression VA(1)–VA(O), while the contribution of the capacitor 1714 may be represented by the expression VA(O)–VA(1). These signals are combined at the node CVSUM such that the potential at node CVSUM at phase P2 may be represented by the expression (VREF+(VA(1)–VA(O)+VA(O)–VA(1)). This combined signal is sensed by latch 1730 and is low-pass filtered to produce the BIAS and BIASN control voltages which are used to auto-zero the comparator 1710. At phase P3, the signals PVE and PVEN gate the signal VAIN (i.e. VA(I)) to the left side of capacitor 1712 after the signals PVD and PVDN have rendered the transmission gate 1716 non-conductive, and responsive to the signals PSMP and PSMPN, the right side of the capacitors 1712 and 1714 are charged to VREF. Between phases P5 and P6, the signal P6S, shown in FIGS. 16d and 16e, changes the signal VAIN from VA(I) to VA(I+1) and the signal PVA switches to logic-one, causing the left side of the capacitor 1714 to switch from VA(1) to VA(0). Thus, at phase P6, the signal at CVSUM is given by equation (5)

$$CVSUM=VREF+VA(I+1)-VA(I)+VA(O)-VA(1) \qquad (5)$$

Thus, the differential voltage from VREF represents the difference between the quantity VA(I+1) and VA(I) on one hand and the quantity VA(1) and VA(O) on the other hand. Since VREF is applied to both nodes CVSUM and CVSUMR, the difference from VREF is the signal that is amplified by the amplifiers 1710 and 1720 and detected by the regenerative latch 1730. If, for example, VA(6)–VA(5) is greater than VA(1)–VA(O) then the signal RCAL increases the potential across capacitor 1646 (shown in FIG. 16c) which, in turn, decreases the resistance of transistor 1630 that shunts resistor R23, to decrease the voltage difference across the resistor. In the exemplary embodiment of the invention, the maximum change in resistance is approximately ±1 Ω. The inventor has determined that this is sufficient to compensate the resistor networks shown in FIG. 15 for resistance variations that are likely to occur in the ADC system shown in FIG. 1.

Figure 5:
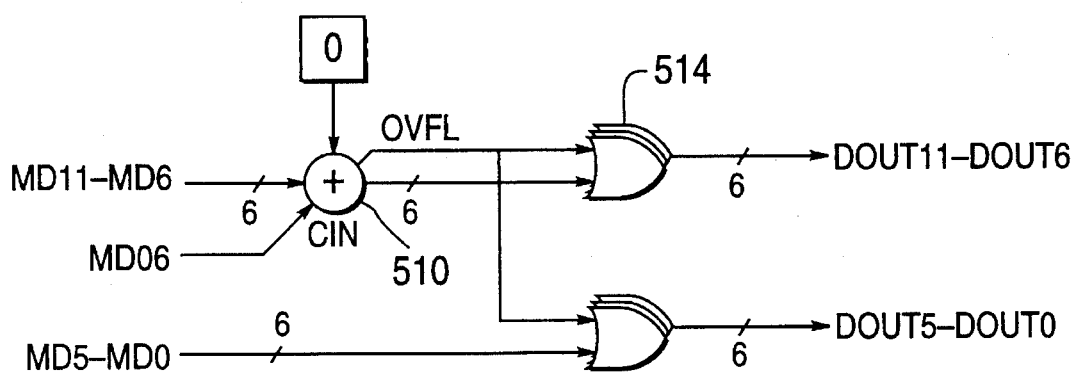
FIG. 5 is a logic diagram of circuitry suitable for use as the format converter shown in FIG. 1.

FIG. 5 is a logic diagram of a format converter suitable for use in the ADC shown in FIG. 2. In this circuit, the output signals MD6 through MD11 of the SAR 122 are applied to one input port of a six-bit adder 510 while a zero-valued signal is applied to the other input port. The signal MDO6, which is used, as described above, to compensate for the offset voltage that is used to reduce the settling time of the input circuitry, is applied to the carry-in (CIN) input terminal of the adder. The individual bits of the output value of the adder 510 are applied to first input terminals of respectively different OR gates 514. The second input terminals of these gates are coupled to receive the overflow output signal (OVFL) of the adder 510. The signal OVFL is also coupled to the second input terminals of four OR gates 516, the first input terminals of which are coupled to receive the output signals MD0 through MD5 of the SAR 122. The output signals of the OR gates are the output signals DOUT0 through DOUT11 of the ADC.

It is to be understood that the embodiments of architecture and circuits described herein are illustrative of the general principles of the invention. Modifications may readily be devised by those skilled in the art without departing from the spirit and scope of the invention. For example, it is contemplated that the autocalibrating resistor ladder network may be used advantageously in other types of ADCs, for example flash-type ADCs to reduce the need for laser trimming. Instead of using one voltage variable resistor per resistor, as shown in FIGS. 15 and 16a, it is contemplated that a single voltage variable resistor may span several taps on the resistor ladder.

I claim:

1. Apparatus which provides a plurality of reference voltages, comprising:
   a resistor ladder, having a first end and a second end coupled to respective first and second sources of reference potential, and having a plurality of serially connected resistors, each having first and second terminals and a resistance defined therebetween;

variable resistance means, coupled to one resistor of the serially connected resistors, for changing the resistance thereof responsive to a control signal;

comparison means, coupled to the one resistor, for generating a difference signal representing a difference between a predetermined reference potential and a potential measured between the first and second terminals of the one resistor; and control means, responsive to the difference signal for generating the control signal for the variable resistance means, said control signal changing the resistance of the one resistor in a sense to reduce the difference signal in magnitude.

2. Apparatus according to claim 1, wherein the variable resistance means includes a transistor having a resistive channel defined between respective first and second electrodes, and a control electrode, responsive to the control signal for changing the resistivity of the resistive channel, wherein the first and second electrodes are coupled to the first and second terminals of the one resistor, respectively.

3. Apparatus according to claim 2, wherein the comparison means includes:

means for periodically measuring the potential between the first and second terminals of the resistor; and means for comparing the measured potential with the reference potential to provide a periodic signal as the difference signal; and the control means includes means for integrating the difference signal to generate the control signal.

4. Apparatus according to claim 3, wherein the control means includes an integrating low-pass filter.

5. Apparatus according to claim 1, further comprising: a plurality of variable resistance means, each coupled to a respectively different one of the serially connected resistors, for changing the resistance thereof responsive to a respective one of a plurality of control signals; wherein:

the comparison means includes means for generating a plurality of difference signals, each difference signal representing a difference between the reference potential and a respective potential measured between the first and second terminals of a respectively different one of said plurality of resistors; and the control means includes means, responsive to said plurality of difference signals for generating the respective plurality of control signals, each of the control signals changing the resistance of the respective one of said plurality of resistances in a sense to reduce the respective difference signal in magnitude.

6. Apparatus according to claim 5, wherein the comparison means includes means for generating said plurality of difference signals sequentially, each of said difference signals being a periodic signal having an instantaneous magnitude which represents said difference at a predetermined instant.

7. Apparatus according to claim 6, further comprising auto-zero circuitry which applies a further reference signal as both the reference potential and the difference signal to the comparison means during periodic calibration intervals and which integrates any difference signal generated during the calibration interval to generate a bias potential for the comparison means to reduce, in magnitude, the difference signal sensed during subsequent ones of said calibration intervals.

8. An analog to digital converter (ADC) comprising:

a voltage reference source which provides a plurality of voltage reference values, the voltage reference source including:

a resistor ladder, having a first end and a second end coupled to respective first and second sources of reference potential, and having a plurality of serially connected resistors, each having first and second terminals and a resistance defined therebetween, for providing a respective plurality of reference voltage values; and autocalibration means, coupled to each of the plurality of resistors including:

means for selecting one of the plurality of resistors;

sampling means for measuring first and second ones of the plurality of reference voltage values provided at the first and second terminals of the selected resistor, respectively;

difference means for generating a value representing a difference between the first and second reference voltage values;

comparison means for comparing the generated difference value to a predetermined reference value to generate a control signal; and control means, coupled to the selected resistor and responsive to the control signal, for changing the resistance defined between the first and second terminals in a sense to match the difference value to the predetermined reference value; and means for comparing an input analog value to an analog signal derived from the plurality of reference voltage values to generate a digital value representing the input analog value.

9. Apparatus according to claim 8, wherein:

the sampling means includes means for periodically measuring the first and second ones of the plurality of reference voltage values; the difference means includes means for generating a periodic signal representing differences between the first and second reference voltage values at respectively different instants; and the comparison means includes means for comparing the generated periodic signal the predetermined reference value to provide a periodic signal as the control signal; and the control means includes means for integrating the control signal to generate a further control signal which indicates an amount by which the resistance of the resistor is changed to match the difference value to the predetermined reference value.

10. Apparatus according to claim 8, further comprising:

a plurality of variable resistance means, each coupled to a respectively different one of the serially connected resistors, for changing the resistance thereof responsive to a respective one of a plurality of adjustment signals; wherein:

the comparison means includes means for generating a plurality of difference signals, each difference signal representing a difference between the predetermined reference potential and a respective potential measured between the first and second terminals of a respectively different one of said plurality of resistors; and the control means includes means, responsive to said plurality of difference signals for generating the respective plurality of adjustment signals, each of the adjustment signals changing the resistance of the respective one of said plurality of resistances in a sense to reduce the respective difference signal in magnitude.

* * * * *